(12) United States Patent
Peeters et al.

(10) Patent No.: US 12,745,331 B2
(45) Date of Patent: Sep. 22, 2026

(54) DIRECT RED LED FOR WHITE LIGHT WITH HIGH USER PREFERENCE

(71) Applicant: SIGNIFY HOLDING B.V., Eindhoven (NL)

(72) Inventors: Martinus Petrus Joseph Peeters, Weert (NL); René Theodorus Wegh, Veldhoven (NL); Grigory Alexandrovich Onushkin, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 13 days.

(21) Appl. No.: 19/106,331

(22) PCT Filed: Aug. 18, 2023

(86) PCT No.: PCT/EP2023/072766
§ 371 (c)(1),
(2) Date: Feb. 25, 2025

(87) PCT Pub. No.: WO2024/041986
PCT Pub. Date: Feb. 29, 2024

(65) Prior Publication Data

US 2026/0082463 A1 Mar. 19, 2026

(30) Foreign Application Priority Data

Aug. 25, 2022 (EP) .................................... 22192058
Nov. 25, 2022 (EP) .................................... 22209583

(51) Int. Cl.
*H05B 47/10* (2020.01)
*H05B 45/20* (2020.01)
(Continued)

(52) U.S. Cl.
CPC ........... *H05B 45/20* (2020.01); *H05B 47/155* (2020.01); *H05B 47/17* (2020.01); *H10H 29/8513* (2025.01)

(58) Field of Classification Search
CPC ........ H05B 45/10; H05B 45/20; H05B 47/10; H05B 47/155; H05B 47/17; H10H 29/8513
See application file for complete search history.

(56) References Cited

U.S. PATENT DOCUMENTS

2005/0135094 A1 6/2005 Lee et al.
2015/0287890 A1 10/2015 Linton et al.
(Continued)

FOREIGN PATENT DOCUMENTS

WO 2019140309 A1 7/2019
WO 2020212325 A1 10/2020

OTHER PUBLICATIONS

Shimizu et al., "Toward commercial realization of quantum dot based white light-emitting diodes for general illumination", Photonics Research, vol. 5, No. 2, Apr. 2017, pp. A1-A6.

*Primary Examiner* — Jimmy T Vu

(57) ABSTRACT

The invention provides a light generating system (1000) comprising one or more primary solid state light sources (50), one or more secondary solid state light sources (60), a first luminescent material arrangement (1210), a second luminescent material arrangement (1220), and a control system (300), wherein: (A) the one or more primary solid state light sources (50) are configured to generate primary light (51); (B) the one or more secondary solid state light sources (60) are configured to generate secondary light (61); (C) the first luminescent material arrangement (1210) is configured in a light receiving relationship with at least one primary solid state light source (50) and is configured to
(Continued)

convert at least part of the primary light (51) of the at least one primary solid state light source (50)) into first luminescent material arrangement light (1211); wherein when the at least one primary solid state light source (50) alone irradiates the first luminescent material arrangement (1210) a first spectral power distribution, comprising the primary light (51) (of the at least one primary solid state light source (50)) and the first luminescent material arrangement light (1211), is obtained; (D) the second luminescent material arrangement (1220) is configured in a light receiving relationship with at least one (other) primary solid state light source (50) and is configured to convert at least part of the primary light (51) into second luminescent material arrangement light (1221); wherein when the at least one (other) primary solid state light source (50) alone irradiates the second luminescent material arrangement (1220) a second spectral power distribution, comprising the primary light (51) and the second luminescent material arrangement light (1221), is obtained; (E) the first spectral power distribution and the second spectral power distribution have v' values differing at least 0.02; wherein the first spectral power distribution has a first color point outside 10 standard deviation of color matching (SDCM) from the black body locus, and wherein the second spectral power distribution has a second color point outside 10 standard deviation of color matching (SDCM) from the black body locus.

15 Claims, 5 Drawing Sheets

(51) Int. Cl.

| | |
|---|---|
| ***H05B 47/155*** | (2020.01) |
| ***H05B 47/17*** | (2020.01) |
| ***H10H 29/851*** | (2025.01) |

(56) References Cited

U.S. PATENT DOCUMENTS

| | | | | |
|---|---|---|---|---|
| 2016/0273717 | A1 | 9/2016 | Krames et al. | |
| 2018/0112850 | A1 | 4/2018 | Van Bommel et al. | |
| 2021/0030905 | A1 | 2/2021 | Barron et al. | |
| 2021/0289599 | A1* | 9/2021 | Meir | F21V 9/30 |

* cited by examiner

DIRECT RED LED FOR WHITE LIGHT WITH HIGH USER PREFERENCE

CROSS-REFERENCE TO PRIOR APPLICATIONS

This application is the U.S. National Phase application under 35 U.S.C. § 371 of International Application No. PCT/EP2023/072766, filed on Aug. 18, 2023, which claims the benefit of European Patent Application No. 22192058.0 filed on Aug. 25, 2022, and European Patent Application No. 2209583.8, filed on Nov. 25, 2022. These applications are hereby incorporated by reference herein.

FIELD OF THE INVENTION

The invention relates to a light generating system and to a lighting device comprising such light generating system.

BACKGROUND OF THE INVENTION

White-light emitting lighting devices are known in the art. US2015287890, for instance, describes a white-light emitting lighting device comprising one or more light emitting light sources (preferably solid state semiconductor light emitting diodes) that emit off-white light during operation, wherein the off-white light includes a spectral output including at least one spectral component in a first spectral region from about 360 nm to about 475 nm, at least one spectral component in a second spectral region from about 475 nm to about 575 nm, and at least one deficiency in at least one other spectral region, and an optical component that is positioned to receive at least a portion of the off-white light generated by the one or more light sources, the optical component comprising an optical material for converting at least a portion of the off-white light to one or more predetermined wavelengths, at least one of which has a wavelength in at least one deficient spectral region, such that light emitted by the lighting device comprises white light, wherein the optical material comprises quantum confined semiconductor nanoparticles.

SUMMARY OF THE INVENTION

There is a desire to provide lighting devices and light generating systems that comply with desirable lighting quality standards. Further, there is a desire to comply with such standards in the most efficient way. Current lighting devices and/or light generating systems may not comply with these standards or may comply with these standards with a less efficient solution. Further, there appears to be a desire to be able to tune the spectral power distribution of the light generated by the lighting device or light generating system. Hence, it is an aspect of the invention to provide an alternative light generating system (and/or lighting device), which preferably further at least partly obviates one or more of above-described drawbacks. The present invention may have as object to overcome or ameliorate at least one of the disadvantages of the prior art, or to provide a useful alternative.

It appears not obvious to meet e.g. a priority level 1, and fidelity level 3, herein also indicated as PIF3, such as described in TM-30 (2020) standard [ANSI/IES TM-30-20: IES Method for Evaluating Light Source Color Rendition https://store.ies.org/product/tm-30-20-ies-method-for-evaluating-light-source-color-rendition/(see table E-2). A number of simulations were executed (see also below), whereby it appeared that essentially only a solution with two different off-white sources of light, based on blue pumps and luminescent material conversion, and a red solid state light source, may allow meeting e.g. the PIF3 and/or P2F3 (priority level 2 and fidelity level 3) requirements at reasonable or high energy efficiency.

Hence, according to a first aspect, the invention provides a light generating system ("system") comprising one or more primary (solid state) light sources, one or more secondary (solid state) light sources, a first luminescent material arrangement, and a second luminescent material arrangement. Optionally, the light generating system may also comprise a control system. Especially, the one or more primary solid state light sources are configured to generate primary light. In embodiments, the primary light may have a peak primary wavelength ($\lambda p1$) in the wavelength range of 430-490 nm. Further, especially the one or more secondary solid state light sources are configured to generate secondary light. In embodiments, the secondary light may have a dominant secondary wavelength ($\lambda d3$) in the wavelength range of 610-630 nm. In embodiments, the first luminescent material arrangement is configured in a light receiving relationship with at least one primary solid state light source. Especially, the first luminescent material arrangement is configured to convert at least part of the primary light of the at least one primary solid state light source into first luminescent material arrangement light. In embodiments, when the at least one primary solid state light source alone irradiates the first luminescent material arrangement a first spectral power distribution, comprising the primary light (of the at least one primary solid state light source) and the first luminescent material arrangement light, may be obtained. Further, in embodiments, the second luminescent material arrangement may be configured in a light receiving relationship with at least one (other) primary solid state light source. Especially, the second luminescent material arrangement is configured to convert at least part of the primary light (of the at least one (other) primary solid state light source) into second luminescent material arrangement light. In embodiments, when the at least one (other) primary solid state light source alone irradiates the second luminescent material arrangement a second spectral power distribution, comprising the primary light (of the at least one (other) primary solid state light source) and the second luminescent material arrangement light, may be obtained. Especially, in embodiments the first spectral power distribution and the second spectral power distribution may have v' values differing at least 0.02. Further, in specific embodiments the first spectral power distribution has a first color point outside 10 standard deviation of color matching (SDCM) from the black body locus (BBL) (especially outside 10 standard deviation of color matching (SDCM) above the black body locus). Alternatively or additionally, in specific embodiments the second spectral power distribution has a second color point outside 10 standard deviation of color matching (SDCM) from the black body locus. Especially, the light generating system may be configured to generate system light. In embodiments, the system light may comprise one or more of (a) the first luminescent material arrangement light, (b) the second luminescent material arrangement light, and (c) the secondary light. In specific embodiments, in a first operational mode of the light generating system, first white system light is provided, having a first correlated color temperature CCT1, wherein the first white system light comprises a spectral power distribution comprising the primary light, the first luminescent material arrangement light, and the secondary light. More especially, in embodiments the control system may be configured to control the system light, such that: (a) in a first operational mode of the light generating system first white system light is provided, having a first correlated color temperature CCT1, wherein the first white system light comprises a spectral power distribution comprising the primary light, the first luminescent material arrangement light, and the secondary light; and/or (b) in a second operational mode of the light generating system second white system light is provided, having a second correlated color temperature CCT2, wherein the second white system light comprises a spectral power distribution comprising the primary light, the second luminescent material arrangement light, and the secondary light. Further, in specific embodiments CCT2–CCT1≥500 K. Therefore, in specific embodiments the invention provides a light generating system comprising one or more primary solid state light sources, one or more secondary solid state light sources, a first luminescent material arrangement, a second luminescent material arrangement, and a control system, wherein: (A) the one or more primary solid state light sources are configured to generate primary light having a peak primary wavelength (λp1) in the wavelength range of 430-490 nm; (B) the one or more secondary solid state light sources are configured to generate secondary light having a dominant secondary wavelength (λd3) in the wavelength range of 610-630 nm; (C) the first luminescent material arrangement is configured in a light receiving relationship with at least one primary solid state light source and is configured to convert at least part of the primary light of the at least one primary solid state light source into first luminescent material arrangement light; wherein when the at least one primary solid state light source alone irradiates the first luminescent material arrangement a first spectral power distribution, comprising the primary light (of the at least one primary solid state light source) and the first luminescent material arrangement light, is obtained; (D) the second luminescent material arrangement is configured in a light receiving relationship with at least one (other) primary solid state light source and is configured to convert at least part of the primary light into second luminescent material arrangement light; wherein when the at least one (other) primary solid state light source alone irradiates the second luminescent material arrangement a second spectral power distribution, comprising the primary light (of the at least one primary solid state light source) and the second luminescent material arrangement light, is obtained; (E) the first spectral power distribution and the second spectral power distribution have v' values differing at least 0.02; wherein the first spectral power distribution has a first color point outside 10 standard deviation of color matching (SDCM) from the black body locus, and wherein the second spectral power distribution has a second color point outside 10 standard deviation of color matching (SDCM) from the black body locus (especially above the BBL); (F) the light generating system is configured to generate system light (comprising one or more of (a) the first luminescent material arrangement light, (b) the second luminescent material arrangement light, and (c) the secondary light); and (G) the control system is configured to control the system light, such that: (G1) in a first operational mode of the light generating system first white system light is provided, having a first correlated color temperature CCT1, wherein the first white system light comprises a spectral power distribution comprising the primary light, the first luminescent material arrangement light, and the secondary light; (G2) in a second operational mode of the light generating system second white system light is provided, having a second correlated color temperature CCT2, wherein the second white system light comprises a spectral power distribution comprising the primary light, the second luminescent material arrangement light, and the secondary light; and (G3) CCT2–CCT1≥500 K.

With such system it appears possible to fulfill the PIF3 and/or P2F3 requirements, with a relatively simple and energy efficient light generating system. Further, it appears possible to fulfill the PIF3 and/or P2F3 requirements over relatively large ranges of correlated color temperatures (CCTs), even in the relatively low correlated color temperature region (e.g. about 3500 K or lower). Further, the invention also allows embodiments wherein the melanopic equivalent daylight illuminance (MEDI) or melanopic daylight efficacy ratio (MDER) can be controlled and/or increased to a relatively high level, beneficial for stimulating circadian rhythm during the day. In this way, CCT and MEDI/MDER may be controlled, in further embodiments even individually. Hence, with the present invention it appears possible to provide light with a high color quality, a high efficiency, and if desired also a controllable and/or high MEDI.

Note that terms like "peak primary wavelength" "dominant secondary wavelength", and similar terms, may also be indicated as "primary peak wavelength" "secondary dominant wavelength", respectively, and thus likewise for similar terms, as will be clear to a person skilled in the art.

As indicated above, the light generating system may comprise one or more primary solid state light sources, one or more secondary solid state light sources, a first luminescent material arrangement, and a second luminescent material arrangement. Optionally, the light generating system may also comprise a control system. These elements will be further discussed below.

The light generating system may comprise at least two types of light sources. A first type of light sources is indicated as "primary light sources". The primary light sources especially comprise solid state light sources. Hence, they are herein further indicated as "primary solid state light sources". The light generating system may comprise one or more primary light sources. A second type of light sources is indicated as "secondary light sources". The secondary light sources (also) especially comprise solid state light sources. Hence, they are herein further indicated as "secondary solid state light sources". The light generating system may comprise one or more secondary light sources. Some aspects in relation to light sources are described below.

The term "light source" may in principle relate to any light source known in the art. It may be a conventional (tungsten) light bulb, a low pressure mercury lamp, a high pressure mercury lamp, a fluorescent lamp, an LED (light emissive diode). In a specific embodiment, the light source comprises a solid state LED light source (such as an LED or laser diode (or "diode laser")). The term "light source" may also relate to a plurality of light sources, such as 2-2000 (solid state) LED light sources. Hence, the term LED may also refer to a plurality of LEDs. Further, the term "light source" may in embodiments also refer to a so-called chip-on-board (COB) light source. The term "COB" especially refers to LED chips in the form of a semiconductor chip that is neither encased nor connected but directly mounted onto a substrate, such as a PCB. Hence, a plurality of light emitting semiconductor light source may be configured on the same substrate. In embodiments, a COB is a multi LED chip configured together as a single lighting module.

The term "light source" may also refer to a chip scaled package (CSP). A CSP may comprise a single solid state die with provided thereon a luminescent material comprising layer. The term "light source" may also refer to a midpower package. A midpower package may comprise one or more solid state die(s). The die(s) may be covered by a luminescent material comprising layer. The die dimensions may be equal to or smaller than 2 mm, such as in the range of e.g. 0.2-2 mm. Hence, in embodiments the light source comprises a solid state light source. Further, in specific embodiments, the light source comprises a chip scale packaged LED. Herein, the term "light source" may also especially refer to a small solid state light source, such as having a mini size or micro size. For instance, the light sources may comprise one or more of mini LEDs and micro LEDs. Especially, in embodiment the light sources comprise micro LEDs or "microLEDs" or "μLEDs". Herein, the term mini size or mini LED especially indicates to solid state light sources having dimensions, such as die dimension, especially length and width, selected from the range of 100 μm-1 mm. Herein, the term u size or micro LED especially indicates to solid state light sources having dimensions, such as die dimension, especially length and width, selected from the range of 100 μm and smaller.

The light source may have a light escape surface. Referring to conventional light sources such as light bulbs or fluorescent lamps, it may be an outer surface of a glass or a quartz envelope. For LED's it may for instance be the LED die, or when a resin is applied to the LED die, the outer surface of the resin. In principle, it may also be the terminal end of a fiber. The term escape surface especially relates to that part of the light source, where the light actually leaves or escapes from the light source. The light source is configured to provide a beam of light. This beam of light (thus) escapes from the light exit surface of the light source.

Likewise, a light generating device may comprise a light escape surface, such as an end window. Further, likewise a light generating system may comprise a light escape surface, such as an end window.

The term "light source" may refer to a semiconductor light-emitting device, such as a light emitting diode (LEDs), a resonant cavity light emitting diode (RCLED), a vertical cavity laser diode (VCSELs), an edge emitting laser, etc., The term "light source" may also refer to an organic light-emitting diode (OLED), such as a passive-matrix (PMOLED) or an active-matrix (AMOLED). In a specific embodiment, the light source comprises a solid-state light source (such as an LED or laser diode). In an embodiment, the light source comprises an LED (light emitting diode). The terms "light source" or "solid state light source" may also refer to a superluminescent diode (SLED).

The term LED may also refer to a plurality of LEDs.

The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as an LED, or downstream of a plurality of solid-state light sources (i.e. e.g. shared by multiple LEDs). In embodiments, the light source may comprise an LED with on-chip optics. In embodiments, the light source comprises pixelated single LEDs (with or without optics) (offering in embodiments on-chip beam steering).

In embodiments, the light source may be configured to provide primary radiation, which is used as such, such as e.g. a blue light source, like a blue LED, or a green light source, such as a green LED, and a red light source, such as a red LED. Such LEDs, which may not comprise a luminescent material ("phosphor") may be indicated as direct color LEDs.

In other embodiments, however, the light source may be configured to provide primary radiation and part of the primary radiation is converted into secondary radiation. Secondary radiation may be based on conversion by a luminescent material. The secondary radiation may therefore also be indicated as luminescent material radiation. The luminescent material may in embodiments be comprised by the light source, such as an LED with a luminescent material layer or dome comprising luminescent material. Such LEDs may be indicated as phosphor converted LEDs or PC LEDs (phosphor converted LEDs). In other embodiments, the luminescent material may be configured at some distance ("remote") from the light source, such as an LED with a luminescent material layer not in physical contact with a die of the LED. Hence, in specific embodiments the light source may be a light source that during operation emits at least light at wavelength selected from the range of 380-470 nm. However, other wavelengths may also be possible. This light may partially be converted by the luminescent material.

In embodiments, the light generating device may comprise a luminescent material. In embodiments, the light generating device may comprise a PC LED. In other embodiments, the light generating device may comprise a direct LED (i.e. no phosphor). In embodiments, the light generating device may comprise a laser device, like a laser diode. In embodiments, the light generating device may comprise a superluminescent diode. Hence, in specific embodiments, the light source may be selected from the group of laser diodes and superluminescent diodes. In other embodiments, the light source may comprise an LED.

The light source may especially be configured to generate light source light having an optical axis (O), (a beam shape,) and a spectral power distribution. The light source light may in embodiments comprise one or more bands, having band widths as known for lasers.

The term "light source" may (thus) refer to a light generating element as such, like e.g. a solid state light source, or e.g. to a package of the light generating element, such as a solid state light source, and one or more of a luminescent material comprising element and (other) optics, like a lens, a collimator. A light converter element ("converter element" or "converter") may comprise a luminescent material comprising element. For instance, a solid state light source as such, like a blue LED, is a light source. A combination of a solid state light source (as light generating element) and a light converter element, such as a blue LED and a light converter element, optically coupled to the solid state light source, may also be a light source (but may also be indicated as light generating device). Hence, a white LED is a light source (but may e.g. also be indicated as (white) light generating device).

The term "light source" herein may also refer to a light source comprising a solid state light source, such as an LED or a laser diode or a superluminescent diode.

The term "light source" may (thus) in embodiments also refer to a light source that is (also) based on conversion of light, such as a light source in combination with a luminescent converter material. Hence, the term "light source" may also refer to a combination of an LED with a luminescent material configured to convert at least part of the LED radiation, or to a combination of a (diode) laser with a luminescent material configured to convert at least part of the (diode) laser radiation.

In embodiments, the term "light source" may also refer to a combination of a light source, like an LED, and an optical filter, which may change the spectral power distribution of the light generated by the light source. Especially, the term "light generating device" may be used to address a light source and further (optical components), like an optical filter and/or a beam shaping element, etc.

The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The term "solid state light source", or "solid state material light source", and similar terms, may especially refer to semiconductor light sources, such as a light emitting diode (LED), a diode laser, or a superluminescent diode.

As indicated above, the one or more primary light sources especially comprise solid state light sources, such as LEDs. The primary light sources may, amongst others, be used to generate blue light, which in embodiments partly can be converted by a luminescent material. Hence, in embodiments the one or more primary solid state light sources are configured to generate primary light having a peak primary wavelength (λp1) in the wavelength range of 430-490 nm. This wavelength range is essentially the blue wavelength range.

The terms "violet light" or "violet emission", and similar terms, may especially relate to light having a wavelength in the range of about 380-440 nm. In specific embodiments, the violet light may have a centroid wavelength in the 380-440 nm range. The terms "blue light" or "blue emission", and similar terms, may especially relate to light having a wavelength in the range of about 440-490 nm (including some violet and cyan hues). In specific embodiments, the blue light may have a centroid wavelength in the 440-490 nm range. The terms "green light" or "green emission", and similar terms, may especially relate to light having a wavelength in the range of about 490-560 nm. In specific embodiments, the green light may have a centroid wavelength in the 490-560 nm range. The terms "yellow light" or "yellow emission", and similar terms, may especially relate to light having a wavelength in the range of about 560-590 nm. In specific embodiments, the yellow light may have a centroid wavelength in the 560-590 nm range. The terms "orange light" or "orange emission", and similar terms, may especially relate to light having a wavelength in the range of about 590-620 nm. In specific embodiments, the orange light may have a centroid wavelength in the 590-620 nm range. The terms "red light" or "red emission", and similar terms, may especially relate to light having a wavelength in the range of about 620-750 nm. In specific embodiments, the red light may have a centroid wavelength in the 620-750 nm range. The terms "cyan light" or "cyan emission", and similar terms, especially relate to light having a wavelength in the range of about 490-520 nm. In specific embodiments, the cyan light may have a centroid wavelength in the 490-520 nm range. The terms "amber light" or "amber emission", and similar terms, may especially relate to light having a wavelength in the range of about 585-605 nm, such as about 590-600 nm. In specific embodiments, the amber light may have a centroid wavelength in the 585-605 nm range. The phrase "light having one or more wavelengths in a wavelength range" and similar phrases may especially indicate that the indicated light (or radiation) has a spectral power distribution with at least intensity or intensities at these one or more wavelengths in the indicated wavelength range. For instance, a blue emitting solid state light source will have a spectral power distribution with intensities at one or more wavelengths in the 440-495 nm wavelength range.

The terms "visible", "visible light" or "visible emission" and similar terms refer to light having one or more wavelengths in the range of about 380-780 nm. Herein, UV may especially refer to a wavelength selected from the range of 190-380 nm, such as 200-380 nm.

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to (at least) visible light.

The term "centroid wavelength", also indicated as λc, is known in the art, and refers to the wavelength value where half of the light energy (especially of a band in a spectral power distribution) is at shorter and half the energy is at longer wavelengths; the value is stated in nanometers (nm). It is the wavelength that divides the integral of a spectral power distribution into two equal parts as expressed by the formula $\lambda c=\Sigma\lambda*I(\lambda)/(\Sigma I(\lambda))$, where the summation is over the wavelength range of interest, and $I(\lambda)$ is the spectral intensity or energy density (i.e. the integration of the product of the wavelength and the intensity over the emission band normalized to the integrated intensity). The centroid wavelength may e.g. be determined at operation conditions.

The terms "dominant wavelength" or "dominant wavelength of a color stimulus" are known in the art, and may especially be defined as a wavelength of the monochromatic stimulus that, when additively mixed in suitable proportions with the specified achromatic stimulus, matches the color stimulus considered in the CIE 1931 x, y chromaticity diagram (see also ANSI/IES LS-1-21, Lighting Science: Nomenclature and Definitions for Illuminating Engineering; https://www.ies.org/definitions/dominant-wavelength-of-a-color-stimulus/.

Hence, in embodiments the one or more primary solid state light sources are configured to generate primary light having a peak primary wavelength (λp1) in the 430-490 nm wavelength range, more especially the 440-490 nm wavelength range.

As indicated above, the one or more secondary light sources are especially solid state light sources, such as LEDs. The secondary light sources may, amongst others, be used to generate orange-red light. Especially, it is not the intention that the secondary light is converted by a luminescent material. However, most luminescent materials suitable for the first luminescent material arrangement and/or the second luminescent material arrangement may essentially not absorb the light of the secondary light sources. Further, the secondary light source can be position in such a way, that they are also not upstream of the first luminescent material arrangement and/or the second luminescent material arrangement. However, such upstream arrangement is herein not excluded. Hence, in embodiments the one or more secondary solid state light sources are configured to generate secondary light having a dominant secondary wavelength (λd3) in the wavelength range of 590-750 nm. More especially, the one or more secondary solid state light sources are configured to generate secondary light having a dominant secondary wavelength (λd3) in the wavelength range of 610-630 nm.

As indicated above, the primary light may be used to generate luminescent material light. Such luminescent material may be configured to convert at least part of the primary light into the luminescent material light. Here below, some embodiments of luminescent materials (in general) are described.

The term "luminescent material" especially refers to a material that can convert first radiation, especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion.

In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex} \leq \lambda_{em}$), though in specific embodiments the luminescent material may comprise up-converter luminescent material, i.e. radiation of a larger wavelength is converted into radiation with a smaller wavelength ($\lambda_{ex} > \lambda_{em}$).

In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence.

The term "luminescent material" may also refer to a plurality of different luminescent materials. Examples of possible luminescent materials are indicated below. Hence, the term "luminescent material" may in specific embodiments also refer to a luminescent material composition. Instead of the term "luminescent material" also the term "phosphor" may be applied. These terms are known to the person skilled in the art.

In embodiments, luminescent materials are selected from garnets and nitrides, especially doped with trivalent cerium or divalent europium, respectively. The term "nitride" may also refer to oxynitride or nitridosilicate, etc. Alternatively or additionally, the luminescent material(s) may be selected from silicates, especially doped with divalent europium.

In specific embodiments the luminescent material comprises a luminescent material of the type $A_3B_5O_{12}$:Ce, wherein A in embodiments comprises one or more of Y, La, Gd, Tb and Lu, especially (at least) one or more of Y, Gd, Tb and Lu, and wherein B in embodiments comprises one or more of Al, Ga, In and Sc. Especially, A may comprise one or more of Y, Gd and Lu, such as especially one or more of Y and Lu.

In embodiments, B may comprise one or more of Al and Ga, more especially at least Al, such as essentially entirely Al. In other embodiments, B may comprise one or more of Al and Ga, more especially at least Ga. The former embodiments may show an emission that is red-shifted relative to an emission of the latter embodiments; or, the latter embodiments show an emission that may be relatively blue-shifted relative to the former embodiments.

Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B may comprise aluminum (Al); however, in addition to aluminum, B may also partly comprise gallium (Ga) and/or scandium (Sc) and/or indium (In), especially up to about 20% of B, more especially up to about 10% of B (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In embodiments, the luminescent material (thus) comprises $A_3B_5O_{12}$ wherein in specific embodiments at maximum 10% of B—O may be replaced by Si—N.

In specific embodiments the luminescent material comprises $(Y_{x1}A'_{x2}Ce_{x3})_3(Al_yB'_{y2})_5O_{12}$, wherein $x1+x2+x3=1$, wherein $x3>0$, wherein $0<x2+x3\leq 0.2$, wherein $y1+y2=1$, wherein $0\leq y2\leq 0.2$, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially $x1>0$, such as $>0.2$, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially, such luminescent materials may have a suitable spectral distribution (see however below), have a relatively high efficiency, have a relatively high thermal stability, and allow a high CRI (optionally in combination with (the) light of other sources of light as described herein). Hence, in specific embodiments A may be selected from the group consisting of Lu and Gd. Alternatively or additionally, B may comprise Ga. Hence, in embodiments the luminescent material comprises $(Y_{x1}(Lu,Gd)_{x2}Ce_{x3})_3(Al_{y1}Ga_{y2})_5O_{12}$, wherein Lu and/or Gd may be available. Even more especially, x3 is selected from the range of 0.001-0.1, wherein $0<x2+x3\leq0.1$, and wherein $0\leq y2\leq0.1$. Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1}Ce_{x3})_3Al_5O_{12}$, wherein $x1+x3=1$, and wherein $0<x3\leq0.2$, such as 0.001-0.1. In specific embodiments, A may especially comprise at least Y, and B may especially comprise at least Al. In other specific embodiments, however, A may especially comprise at least one or more of Gd and Lu, and B may especially comprise at least Ga.

Alternatively or additionally, wherein the luminescent material may comprises a luminescent material of the type $A_3Si_6N_{11}:Ce^{3+}$, wherein A comprises one or more of Y, La, Gd, Tb and Lu, such as in embodiments one or more of La and Y.

In embodiments, the luminescent material may alternatively or additionally comprise one or more of $MS:Eu^{2+}$ and/or $M_2Si_5N_8:Eu^{2+}$ and/or $MAlSiN_3:Eu^{2+}$ and/or $Ca_2AlSi_3O_2N_5:Eu^{2+}$, etc., wherein M comprises one or more of Ba, Sr, and Ca, especially in embodiments at least Sr. Hence, in embodiments, the luminescent material may comprise one or more materials selected from the group consisting of (Ba,Sr,Ca)S:Eu, $(Ba,Sr,Ca)AlSiN_3:Eu$ and $(Ba,Sr,Ca)_2Si_5N_8:Eu$. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in $CaAlSiN_3:Eu$, the correct formula could be $(Ca_{0.98}Eu_{0.02})AlSiN_3$. Divalent europium will in general replace divalent cations, such as the above divalent alkaline earth cations, especially Ca, Sr or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material $(Ba,Sr,Ca)_2Si_5N_8:Eu$ can also be indicated as $M_2Si_5N_8:Eu$, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8:Eu$ (i.e. 75% Ba; 25% Sr). Here, Eu is introduced and replaces at least part of M, i.e. one or more of Ba, Sr, and Ca). Likewise, the material $(Ba,Sr,Ca)AlSiN_3:Eu$ can also be indicated as $MAlSiN_3:Eu$, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Eu in the above indicated luminescent materials is substantially or only in the divalent state, as is known to the person skilled in the art.

In embodiments, a red luminescent material may comprise one or more materials selected from the group consisting of (Ba,Sr,Ca)S:Eu, $(Ba,Sr,Ca)AlSiN_3:Eu$ and $(Ba,Sr,Ca)_2Si_5N_8:Eu$. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in $CaAlSiN_3:Eu$, the correct formula could be $(Ca_{0.98}Eu_{0.02})AlSiN_3$. Divalent europium will in general replace divalent cations, such as the above divalent alkaline earth cations, especially Ca, Sr or Ba.

The material (Ba,Sr,Ca)S:Eu can also be indicated as MS:Eu, wherein M is one or more elements selected from the group consisting of barium (Ba), strontium (Sr), and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material $(Ba,Sr,Ca)_2Si_5N_8:Eu$ can also be indicated as $M_2Si_5N_8:Eu$, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8:Eu$ (i.e. 75% Ba; 25% Sr). Here, Eu is introduced and replaces at least part of M, i.e. one or more of Ba, Sr, and Ca).

Likewise, the material $(Ba,Sr,Ca)AlSiN_3:Eu$ can also be indicated as $MAlSiN_3:Eu$, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Eu in the above indicated luminescent materials is substantially or only in the divalent state, as is known to the person skilled in the art.

Blue luminescent materials may comprise YSO ($Y_2SiO_5:Ce^{3+}$), or similar compounds, or BAM ($BaMgAl_{10}O_{17}:Eu^{2+}$), or similar compounds.

The term "luminescent material" herein especially relates to inorganic luminescent materials.

Alternatively or additionally, also other luminescent materials may be applied. For instance quantum dots and/or organic dyes may be applied and may optionally be embedded in transmissive matrices like e.g. polymers, like PMMA, or polysiloxanes, etc, etc. Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nano-wires, etcetera.

Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Different luminescent materials may have different spectral power distributions of the respective luminescent material light. Alternatively or additionally, such different luminescent materials may especially have different color points (or dominant wavelengths).

As indicated above, other luminescent materials may also be possible. Hence, in specific embodiments the luminescent material is selected from the group of divalent europium containing nitrides, divalent europium containing oxynitrides, divalent europium containing silicates, cerium comprising garnets, and quantum structures. Quantum structures may e.g. comprise quantum dots or quantum rods (or other quantum type particles) (see above). Quantum structures may also comprise quantum wells. Quantum structures may also comprise photonic crystals.

Herein, (at least) two luminescent material arrangements may be applied.

A first luminescent material arrangement, in combination with at least one primary solid state light source, may be configured to provide off-white light. While being off-white, together with the secondary light, white light may be generated within about 10 SDCM from the BBL, such as within about 7 SDCM, even more especially within about 5 SDCM.

The first luminescent material arrangement may comprise a layer, or a multi-layer, comprising one or more luminescent materials, which layer, or multi-layer, may be configured on the die of a solid state light source, like a coating, or may be configured in a light transmissive body on the die of a solid state light source, or may be configured remote from the solid state light source. Especially, however, the layer or multi-layer, or the light transmissive body comprising the one or more luminescent materials, may be configured on the die. The term "die" may refer to the light emitting surface of a solid state light source, such as a LED die.

The term "white light", and similar terms, herein, is known to the person skilled in the art. It may especially relate to light having a correlated color temperature (CCT) between about 1800 K and 20000 K, such as between 2000 and 20000 K, especially 2700-20000 K, for general lighting especially in the range of about 2000-7000 K, such as in the range of 2700 K and 6500 K. In embodiments, e.g. for backlighting purposes, or for other purposes, the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

Therefore, the first luminescent material arrangement may be configured in a light receiving relationship with at least one primary solid state light source and may be configured to convert at least part of the primary light of the at least one primary solid state light source into first luminescent material arrangement light.

The terms "light-receiving relationship" or "light receiving relationship", and similar terms, may indicate that an item may during operation of a source of light (like a light generating device or light generating element or light generating system) may receive light from that source of light. Hence, the item may be configured downstream of that source of light. Between the source of light and the item, optics may be configured. The terms "upstream" and "downstream", such as in the context of propagation of light, may especially relate to an arrangement of items or features relative to the propagation of the light from a light generating element (here the especially the respective solid state light source), wherein relative to a first position within a beam of light from the light generating element, a second position in the beam of light closer to the light generating element (than the first position) is "upstream", and a third position within the beam of light further away from the light generating element (than the first position) is "downstream". Instead of the term "light generating element" also the term "light generating means" may be applied.

As can be derived from the above, when the at least one primary solid state light source alone irradiates the first luminescent material arrangement a first spectral power distribution, comprising the primary light (of the at least one primary solid state light source) and the first luminescent material arrangement light, is obtained. Note that this condition "when the at least one primary solid state light source alone irradiates the first luminescent material arrangement" does not necessarily imply that during operation of the system, always, the at least one primary solid state light source alone irradiates the first luminescent material arrangement". However, would the at least one primary solid state light source alone irradiate the first luminescent material arrangement a first spectral power distribution is obtained. As indicated above, this first spectral power distribution may be off-white; only by addition of the secondary light, white light having a color point within about 10 SDCM from the BBL may be obtained.

A second luminescent material arrangement, in combination with at least one primary solid state light source, may (also) be configured to provide off-white light. While being off-white, together with the secondary light, (also) white light may be generated within about 10 SDCM from the BBL, such as within about 7 SDCM, even more especially within about 5 SDCM.

The second luminescent material arrangement may comprise a layer, or a multi-layer, comprising one or more luminescent materials, which layer, or multi-layer, may be configured on the die of a solid state light source, like a coating, or may be configured in a light transmissive body on the die of a solid state light source, or may be configured remote from the solid state light source. Especially, however, the layer or multi-layer, or the light transmissive body comprising the one or more luminescent materials, may be configured on the die.

Therefore, the second luminescent material arrangement may be configured in a light receiving relationship with at least one (other) primary solid state light source and is configured to convert at least part of the primary light into second luminescent material arrangement light.

As can be derived from the above, when the at least one (other) primary solid state light source alone irradiates the second luminescent material arrangement a second spectral power distribution, comprising the primary light (of the at least one primary solid state light source) and the second luminescent material arrangement light, is obtained. Note that this condition "when the at least one secondary solid state light source alone irradiates the second luminescent material arrangement" does not necessarily imply that during operation of the system, always, the at least one secondary solid state light source alone irradiates the second luminescent material arrangement". However, would the at least one secondary solid state light source alone irradiate the second luminescent material arrangement a second spectral power distribution is obtained. As indicated above, this second spectral power distribution may be off-white; only by addition of the secondary light, white light having a color point within about 10 SDCM from the BBL may be obtained. Hence, the off-white spectra may be outside 10 SDCM of the BBL, especially more than 10 SDCM above the BBL, whereas the first system light and the second system light maybe within 10 SDCM from the BBL, more especially on or below the BBL (but not more than 10 SDCM, such as not more than 7 SDCM).

As can be derived from the above, there may be at least one primary solid state light source configured upstream of the first luminescent material arrangement and there may be at least one (other) primary solid state light source configured upstream of the second luminescent material arrangement. Here below, the former are also indicated as "one or more first pump light sources", and the latter are also indicated as "one or more second pump light sources". Especially, in embodiments the luminescent material arrangement downstream of the former differs from the luminescent material arrangement of the latter. The difference may in embodiments be in one or more of layer thickness and layer composition (such as e.g. weight percentage of the luminescent material in the layer). The term "layer composition" may especially refer to type of luminescent material comprised by the layer or the composition of the luminescent materials in the layer. For instance, a first layer comprising two different types of garnet luminescent materials may differ from a second layer comprising only one of such different types of garnet luminescent materials. Further, for instance a first layer comprising a garnet luminescent material and not including another luminescent material differs from a second layer comprising the same garnet luminescent and another luminescent material, such as a red emitting narrow band luminescent material (see also below). Further, two layers comprising essentially the same luminescent material(s) but having different layer thicknesses (leading to different absorptions) may provide luminescent material arrangements differing in layer thicknesses of a luminescent material comprising layer. Yet further, two layers comprising essentially the same luminescent material (s) and essentially having the same layer thicknesses, but having different weight percentages of the same luminescent material (leading to different absorptions and optionally also to shifted luminescences dependent upon the weight percentage) may provide luminescent material arrangements differing in compositions of a luminescent material comprising layer. Of course, other embodiments may also be possible.

As indicated above, both the first spectral power distribution and the second spectral power distribution may be substantially off-white. In embodiments, the first spectral power distribution has a first color point outside 5 standard deviation of color matching (SDCM) from the black body locus, more especially outside 7 SDCM. Alternatively or additionally, in embodiments, the second spectral power distribution has a second color point outside 5 standard deviation of color matching (SDCM) from the black body locus, more especially outside 7 SDCM. In specific embodiments, the first spectral power distribution has a first color point outside 10 standard deviation of color matching (SDCM) from the black body locus, and the second spectral power distribution has a second color point outside 10 standard deviation of color matching (SDCM) from the black body locus.

Further, especially the first spectral power distribution and the second spectral power distribution may differ. One may be off-white, but closer to relatively lower CCTs and the other one may be off-white but closer to relatively higher CCTs. Especially, in embodiments the first spectral power distribution and the second spectral power distribution have v' values differing at least 0.015, especially at least 0.02, such as in embodiments at least about 0.025. Especially, the differences may be such, that upon admixing with secondary light to arrive at white light within 10 SDCM from the BBL, the correlated color difference is at least 500 K, such as at least about 1000 K.

The light generating system is especially configured to generate system light. The system light may comprise one or more of (a) the first luminescent material arrangement light, (b) the second luminescent material arrangement light, and (c) the secondary light.

Further, the system light may comprise part of the primary light. Hence, part of the primary light may not have been converted by the first luminescent material arrangement and/or the second luminescent material arrangement. More especially, the primary solid state light source and the first luminescent material arrangement and the second luminescent material arrangement may be configured such that part of the primary light is not converted by the first luminescent material arrangement and/or the second luminescent material arrangement. This partial conversion may be due to one or more of a configuration wherein part of the primary light is reflected (in a reflective configuration) or transmitted (in a transmissive configuration), and or by a configuration where part of the primary light bypasses first luminescent material arrangement and the second luminescent material arrangement (and cannot be absorbed at all by the first luminescent material arrangement and/or the second luminescent material arrangement). Especially, herein the configuration of the luminescent material arrangements is a transmissive configuration.

As indicated above, the light generating system may also comprise a control system (or may be functionally coupled to a control system). Especially, the control system may allow at least two operational modes of the light generating system.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc., Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions from a remote control. In embodiments, the control system may be controlled via an App on a device, such as a portable device, like a Smartphone or I-phone, a tablet, etc. The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, Thread, WIFI, LiFi, ZigBee, BLE or WiMAX, or another wireless technology.

The system, or apparatus, or device may execute an action in a "mode" or "operation mode" or "mode of operation" or "operational mode". The term "operational mode may also be indicated as "controlling mode". Likewise, in a method an action or stage, or step may be executed in a "mode" or "operation mode" or "mode of operation" or "operational mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, which can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

In the first operational mode, the correlated color temperature is relatively lower, and in the second operational mode, the correlated color temperature is relatively higher. As will be further elucidated below, the fact that two operational modes may be available, does not exclude the presence of further operational modes.

Especially, in embodiments the control system may be configured to control the system light, such that: (i) in a first operational mode of the light generating system first white system light is provided, and such that (ii) in a second operational mode of the light generating system second white system light is provided.

Especially, the first white system light may have a first correlated color temperature CCT1. Further, the first white system light comprises a spectral power distribution comprising the primary light, the first luminescent material arrangement light, and the secondary light. Further, especially the second white system light may have a second correlated color temperature CCT2. Yet further, the second white system light may comprise a spectral power distribution comprising the primary light, the second luminescent material arrangement light, and the secondary light. Yet, in embodiments CCT2−CCT1≥500 K.

Hence, amongst others the invention provides a tunable white light generating device, with a CCT range of at least 500 K, or larger. In embodiments, the CCT (of the white system light) may be controlled between a first value (CCT1) and a second value (CCT2), wherein |CCT2−CCT1|≥500 K, more especially |CCT2−CCT1|≥1000 K. In specific embodiments, |CCT2−CCT1|≥1500 K, such as |CCT2−CCT1|≥1800 K, like more especially |CCT2−CCT1|≥2000 K. In further embodiments, over essentially the entire CCT range, the system light may follow the black body locus. For instance, over the entire correlated color temperature range the system light may have a duv value of +/−0.01, relative to the black body locus, more especially selected from the range of 0-0.01 below the BBL, such as 0-0.006 below the BBL. Therefore, in embodiments the white system light may have a controllable correlated color temperature over a correlated color temperature range of at least 1000 K, wherein the correlated color temperature range includes the first correlated color temperature CCT1 and the second correlated color temperature CCT2, wherein over the entire correlated color temperature range the system light has a duv value of +/−0.01 relative to the black body locus.

In embodiments, the first correlated color temperature CCT1 may be selected from the range of 1800-4000 K, and the second correlated color temperature CCT2 is selected from the range of 4000-8000 K. As indicated above, CCT2−CCT1≥500 K may apply, more especially CCT2−CCT1≥1000 K.

As indicated above, the first spectral power distribution and the second spectral power distribution, i.e. especially the light generated by the respective primary solid state light sources and the respective light source arrangements, thus in the absence of light of the secondary solid state light source, are off-white. In embodiments, the first spectral power distribution has a first color point outside 15 standard deviation of color matching (SDCM) from the black body locus, and/or the second spectral power distribution has a second color point outside 15 standard deviation of color matching (SDCM) from the black body locus. More especially, the first spectral power distribution has a first color point outside 20 standard deviation of color matching (SDCM) from the black body locus, and/or the second spectral power distribution has a second color point outside 20 standard deviation of color matching (SDCM) from the black body locus, or even at least 25 SDCM from the black body locus for one or more of the first spectral power distribution and the second spectral power distribution.

In embodiments, the peak primary wavelength ($\lambda p1$) may be selected from the wavelength range of 435-460 nm. More especially, the peak primary wavelength ($\lambda p1$) may be selected from the wavelength range of 438-458 nm. In further specific embodiments (see also below), the peak primary wavelength (λp1) may be selected from the wavelength range of 452-458 nm. Especially then, best results in terms of efficiency and meeting optical requirements may be obtained.

Alternatively or additionally, the dominant secondary wavelength (λd3) may be selected from the wavelength range of 615-625 nm, more especially from the wavelength range of 616-622 nm. Especially then, best results in terms of efficiency and meeting optical requirements may be obtained.

Desirably, the first luminescent material arrangement may be pumped with pump light from a first primary solid state light source and the second luminescent material arrangement may be pumped with pump light from a second primary solid state light source. As will be further described below, in embodiments these pump light sources may essentially be the same, or may be different. As indicated above and as further described below, especially they may be individually controllable.

Therefore, in embodiments the one or more primary solid state light sources may comprise one or more first pump light sources and one or more second pump light sources. Especially, in embodiments the one or more first pump light sources are configured to generate first pump light having a first pump peak wavelength (λp11) in—in specific embodiments—the wavelength range of 430-490 nm. Further, in embodiments the one or more second pump light sources are configured to generate second pump light having a second pump peak wavelength (λ12) in—in specific embodiments—the wavelength range of 430-490 nm. In embodiments, the first luminescent material arrangement may be configured in a light receiving relationship with the one or more first pump light sources and may be configured to convert at least part of the first pump light of the one or more first pump light sources into first luminescent material arrangement light. Further, in embodiments, when the one or more first pump light sources alone irradiate the first luminescent material arrangement the first spectral power distribution comprising the first pump light (of one or more first pump light sources) and the first luminescent material arrangement light, is obtained. Further, in embodiments the second luminescent material arrangement may be configured in a light receiving relationship with the one or more second pump light sources and may be configured to convert at least part of the second pump light of the one or more second pump light sources into second luminescent material arrangement light. Further, in embodiments, when the one or more second pump light sources alone irradiate the second luminescent material arrangement the second spectral power distribution comprising the second pump light (of one or more second pump light sources) and the second luminescent material arrangement light, is obtained.

This allows an individual addressing of the pump light sources, thereby allowing control over the spectral power distribution of the system light, which may comprise a contribution of one or more of the first spectral power distribution (when using the first pump light) and the second spectral power distribution (when using the second pump light). Therefore, in embodiments (wherein the light generating system comprises the control system), the control system may be configured to individually control the one or more first pump light sources and the one or more second pump light sources. More especially, the control system may be configured to individually control the one or more first pump light sources, the one or more second pump light sources, and the one or more secondary solid state light sources.

Especially, in embodiments the control system may be configured to control the system light, such that: (i) in a first operational mode of the light generating system first white system light is provided, and such that (ii) in a second operational mode of the light generating system second white system light is provided. Would only the lowest CCTs be desirable, then in embodiments essentially only the first spectral power distribution may be provided, optionally with variable contributions of the secondary light (leading to the first white system light with a relatively low CCT and optionally some possible variations thereon due to the variable contributions of the secondary light). Would only the highest CCTs be desirable, then in embodiments essentially only the second spectral power distribution may be provided, optionally with variable contributions of the secondary light (leading to the second white system light with a relatively high CCT and optionally some possible variations thereon due to the variable contributions of the secondary light).

For intermediate CCT solutions, the first white system light and the second white system light may be provided, wherein the relative contributions may define the CCT of the system light. The relative contributions may be controlled by controlling the power provided to the (a) one or more primary solid state light sources (for the primary light for the first luminescent material arrangement), (b) the one or more (other) primary solid state light sources (the primary light of for the second luminescent material arrangement), and (c) the one or more secondary solid state light sources (for the secondary light). Alternatively (or additionally), via pulse-width modulation the relative contributions of (a) the primary light of the one or more primary solid state light sources for the first luminescent material arrangement, (b) the primary light of the one or more (other) primary solid state light sources for the second luminescent material arrangement, and (c) the secondary light of the one or more secondary solid state light sources may be controlled.

Therefore, in embodiments the light generating system may comprise a multi-channel configuration comprising: (i) a first channel comprising the one or more primary solid state light sources (for the primary light for the first luminescent material arrangement), (ii) a second channel comprising the one or more (other) primary solid state light sources (the primary light of for the second luminescent material arrangement), and (iii) a third channel comprising the one or more secondary solid state light sources (for the secondary light). Yet, in embodiments the light generating system may comprise a multi-channel configuration comprising: (i) a first channel comprising the one or more first pump light sources, (ii) a second channel comprising the one or more second pump light sources, and (iii) a third channel comprising the one or more secondary solid state light sources.

Note that one or more secondary light sources may be used for both the first system light and the second system light. Though two (or more) separate channels for secondary light sources for the respective first system light and the second system light is herein not excluded, a single channel may suffice.

This may in embodiments imply that, when there are two or more first pump light sources, that they may be controlled as set of first pump light sources, or when there are two or more first pump light sources, subsets of each one or more first pump light sources, may be controlled individually. This may in embodiments also imply that, when there are two or more second pump light sources, that they may be controlled as set of second pump light sources, or when there are two or more second pump light sources, subsets of each one or more second pump light sources, may be controlled individually. Likewise, this may in embodiments also imply that, when there are two or more secondary solid state light sources, that they may be controlled as set of secondary solid state light sources, or when there are two or more secondary solid state light sources, subsets of each one or more secondary solid state light sources, may be controlled individually.

In embodiments, the one or more first solid state light sources and the one or more second solid state light sources are selected from a same bin. In specific embodiments, the first pump peak wavelength (λp11) and the second pump peak wavelength (λp21) are the same. For instance, in embodiments $|\lambda 11-\lambda 12| \leq 5$ nm, such as $|\lambda 11-\lambda 12| \leq 2.5$ nm. This may make the system even less complicated to build.

In other embodiments, the one or more first solid state light sources and the one or more second solid state light sources are selected from different bins. For instance, in embodiments $|\lambda 11-\lambda 12| \geq 7.5$ nm, such as $|\lambda 11-\lambda 12| \geq 10$ nm. In specific embodiments, the first pump peak wavelength (λp11) and the second pump peak wavelength (λp21) may differ with at least 5 nm.

Even when the dominant wavelengths differ (or would they be the same), the first pump peak wavelength (λp11) and the second pump peak wavelength (λ12) may be selected from the wavelength range of 435-460 nm. In specific embodiments, the first pump peak wavelength (λp11) may be selected from the wavelength range of 450-460 nm, such as selected from the range of 452-458 nm. Yet, in further specific embodiments, the second pump peak wavelength (λ12) may be selected from the wavelength range of 436-460 nm, such as selected from the range of 438-458 nm. Further, as indicated above, the dominant secondary wavelength (λd3) is selected from the wavelength range of 615-625 nm. Especially then, best results in terms of efficiency and meeting optical requirements may be obtained.

As indicated above, would one or more of the primary light sources, such as in embodiments one or more first pump light sources, alone irradiate the first luminescent material arrangement, the off-white first spectral power distribution is obtained. In embodiments, the first spectral power distribution may have a first color point with $0.333 \leq x \leq 0.387$ and $0.437 \leq y \leq 0.473$. Further, as indicated above, would one or more other of the primary light sources, such as in embodiments one or more second pump light sources, alone irradiate the second luminescent material arrangement, the off-white second spectral power distribution is obtained. In embodiments, the second spectral power distribution may have the second color point as defined in claim 2 with $0.258 \leq x \leq 0.302$ and $0.331 \leq y \leq 0.358$.

The first luminescent material arrangement and the second luminescent material arrangement may comprise a first luminescent material and a second luminescent material, respectively. Note that the term "first luminescent material" may also refer to a plurality of (different) first luminescent materials. Likewise, the term "second luminescent material" may also refer to a plurality of (different) second luminescent materials. Especially, both arrangements may each comprise a luminescent material of the garnet type.

In embodiments, the first luminescent material arrangement may comprise a first luminescent material, the second luminescent material arrangement may comprise a second luminescent material, and both the first luminescent material and the second luminescent material may comprise a luminescent material of the type $A_3B_5O_{12}$:Ce, wherein A comprises one or more of Y, La, Gd, Tb and Lu, and wherein B comprises one or more of Al, Ga, In and Sc. Further embodiments of such luminescent materials are described above.

In specific embodiments, the first luminescent material may be configured to convert at least part of the primary light of the at least one primary solid state light source into first luminescent material light, wherein the first luminescent material arrangement light may comprise the first luminescent material light, wherein the first luminescent material light has—in specific embodiments—a first centroid wavelength selected from the wavelength range of 520-570 nm. Further, in specific embodiments the second luminescent material may be configured to convert at least part of the primary light of the at least one (other) primary solid state light source into second luminescent material light, wherein the second luminescent material arrangement light may comprise the second luminescent material light, wherein the second luminescent material light has—in specific embodiments—a second centroid wavelength selected from the wavelength range of 520-570 nm.

In specific embodiments, the first luminescent material light may have a first centroid wavelength selected from the wavelength range of 549-559 nm, such as selected from the wavelength range of 550-558 nm. Alternatively or additionally, in specific embodiments the second luminescent material light may have a second centroid wavelength selected from the wavelength range of 534-557 nm, such as selected from the wavelength range of 535-557 nm.

In embodiments, the first centroid wavelength (of the first luminescent material light) and the second centroid wavelength (of the second luminescent material light) may be essentially the same. Hence, in embodiments the spectral power distributions of the first luminescent material light and the second luminescent material light may essentially be the same. In such embodiments, the spectral power distributions of the first pump light and second pump light may differ. For instance, the pump peak wavelengths may differ by at least 5 nm (see also above). In alternative embodiments, the spectral power distributions of the first pump light and second pump light do not substantially differ and the dominant wavelengths may essentially be the same. In such embodiments, the spectral power distribution of the first luminescent material light and the second luminescent material light may differ. In yet alternative embodiments, the spectral power distribution of the first pump light and of the second pump light do differ and the spectral power distribution of the first luminescent material light and the second luminescent material light may differ. In specific embodiments, the first luminescent material and the second luminescent material are different luminescent materials, wherein the first luminescent material light is red-shifted relative to the second luminescent material light (and wherein (thus) the second luminescent material light is blue-shifted relative to the first luminescent material light). In yet further specific embodiments, the first centroid wavelength and the second centroid wavelength may differ with at least 5 nm and at maximum 70 nm.

In yet other embodiments, first spectral power distributions and second spectral power distributions differing from each other may be obtained with essentially the same pump peak wavelengths and essentially the same spectral power distributions of the luminescent material light and second luminescent material light, but by using different ratios of the spectral power distributions of the luminescent material light and spectral power distributions of the pump light in the first spectral power distributions and second spectral power distributions. Hence, when the first luminescent material and the second luminescent material are the same, but e.g. different layer thicknesses of the luminescent material, or different weight rations in a luminescent material layer are applied, different first spectral power distributions and second spectral power distributions may be obtained. Hence, in specific embodiments the first pump peak wavelength (λp11) and the second pump peak wavelength (λp21) may be the same, and the first luminescent material and the second luminescent material may be the same luminescent materials.

Further, in embodiments (a) the peak wavelength (λp1) of the one or more primary light sources configured upstream of the second luminescent material arrangement (i.e. for generating the relatively higher CCT second white system light)/the second pump peak wavelengths (λ21) of the one or more first pump light sources, may be selected from the wavelength range of 450-460 nm, such as selected from the 452-458 nm wavelength range, and (b) the second luminescent material light may have a second centroid wavelength selected from the wavelength range of 530-545 nm, more especially from the 535-540 nm. This may e.g. provide PIF3 compliance over the CCT range 2700-5000K with a relatively high efficiency.

The contribution of the secondary light of the secondary solid state light sources to first white system light (i.e. in addition to the first spectral power distribution) may be relatively high, especially at lower first CCTs of the first white system light. This contribution may be reduced when the first luminescent material arrangement also has (substantial) spectral intensity in the wavelength range of about 610 nm and higher. Therefore, in embodiments the first luminescent material arrangement may comprise a third luminescent material, wherein the third luminescent material is configured to convert at least part of the primary light of the at least one primary solid state light source into third luminescent material light. Especially, in embodiments the third luminescent material light has a centroid wavelength (λ3c) selected from the range of 610-650 nm and a full width half maximum of at maximum 70 nm, or especially of at maximum 60 nm or smaller. Especially, in embodiments the third luminescent material light has a centroid wavelength (λ3c) selected from the range of 620-650 nm.

Especially, the third luminescent may be a relatively narrow band emitter. With such luminescent material(s), the efficiency may be relatively high, while CRI may also be high. A broad band emitter in the (far) red may be less efficient. In embodiments, the third luminescent material may comprise one or more emission bands, having full width half maxima (FWHM) of at maximum 70 nm, more especially at maximum 60 nm, such as at maximum 50 nm.

In specific embodiments, the third luminescent material may comprise one or more emission lines, having full width half maxima of at maximum about 30 nm, more especially at maximum 20 nm.

In specific embodiments, the third luminescent material comprises a luminescent material of the type $M'_xM_{2-2x}AX_6$ doped with tetravalent manganese, wherein M' comprises an alkaline earth cation, M comprises an alkaline cation, and x is in the range of 0-1, wherein A comprises a tetravalent cation, comprising one or more of silicon and titanium, wherein X comprises a monovalent anion, at least comprising fluorine.

A luminescent material of the type $M'_xM_{2-2x}AX_6$ doped with tetravalent manganese is amongst others described in WO2013121355A1, which is herein incorporated by reference. Passages from WO2013121355A1 are also copied herein.

Herein, $M'_xM_{2-2x}AX_6$ doped with tetravalent manganese, may further also shortly be indicated as "phosphor", i.e. the phrase "phosphor comprising $M'_xM_{2-2x}AX_6$ doped with tetravalent manganese" may in an embodiment also be read as $M'M_{2-2x}AX_6$ doped with tetravalent manganese phosphor, or (tetravalent) Mn-doped $M'_xM_{2-2x}AX_6$ phosphor, or shortly "phosphor".

Relevant alkaline cations (M) are sodium (Na), potassium (K) and rubidium (Rb). Optionally, also lithium and/or cesium may be applied. In a preferred embodiment, M comprises at least potassium. In yet another embodiment, M comprises at least rubidium. The phrase "wherein M comprises at least potassium" indicates for instance that of all M cations in a mole $M'_xM_{2-2x}AX_6$, a fraction comprises K' and an optionally remaining fraction comprises one or more other monovalent (alkaline) cations (see also below). In another preferred embodiment, M comprises at least potassium and rubidium. Optionally, the $M'_xM_{2-2x}AX_6$ luminescent material has the λexagonal phase. In yet another embodiment, the $M'_xM_{2-2x}AX_6$ luminescent material has the cubic phase.

Relevant alkaline earth cations (M') are magnesium (Mg), strontium (Sr), calcium (Ca) and barium (Ba), especially one or more of Sr and Ba.

In an embodiment, a combination of different alkaline cations may be applied. In yet another embodiment, a combination of different alkaline earth cations may be applied. In yet another embodiment, a combination of one or more alkaline cations and one or more alkaline earth cations may be applied. For instance, $KRb_{0.5}Sr_{0.25}AX_6$ might be applied. As indicated above, x may be in the range of 0-1, especially x<1. In an embodiment, x=0.

The term "tetravalent manganese" refers to $Mn^{4+}$. This is a well-known luminescent ion. In the formula as indicated above, part of the tetravalent cation A (such as Si) is being replaced by manganese. Hence, $M'_xM_{2-2x}AX_6$ doped with tetravalent manganese may also be indicated as $M'_xM_{2-2x}A_{1-m}Mn_mX_6$. The mole percentage of manganese, i.e. the percentage it replaces the tetravalent cation A will in general be in the range of 0.1-15%, especially 1-12%, i.e. m is in the range of 0.001-0.15, especially in the range of 0.01-0.12.

A comprises a tetravalent cation, and preferably at least comprises silicon. A may optionally (further) comprise one or more of titanium (Ti), germanium (Ge), stannum (Sn) and zinc (Zn). Preferably, at least 80%, even more preferably at least 90%, such as at least 95% of M consists of silicon. Hence, in a specific embodiment, $M'_xM_{2-2x}AX_6$ may also be described as $M'_xM_{2-2x}A_{1-m-t-g-s-zr}Mn_mTi_tGe_gSn_sZr_{zr}X_6$, wherein m and x are as indicated above, and wherein t,g,s,zr are each individually preferably in the range of 0-0.2, especially 0-0.1, even more especially 0-0.05, wherein t+g+s+zr is smaller than 1, especially equal to or smaller than 0.2, preferably in the range of 0-0.2, especially 0-0.1, even more especially 0-0.05, and wherein A is especially Si. X is preferably fluorine (F).

As indicated above, M relates to monovalent cations, but preferably at least comprises potassium and/or rubidium. Other monovalent cations that may further be comprised by M can be selected from the group consisting of lithium (Li), sodium (Na), cesium (Cs) and ammonium ($NH_4^+$). In an embodiment, preferably at least 80% (i.e. 80% of all moles of the type M), even more preferably at least 90%, such as 95% of M consists of potassium and/or rubidium. Especially, in these embodiments x is thus zero.

Hence, in a specific embodiment, $M'_xM_{2-2x}AX_6$ can also be described as $(K_{1-r-l-n-c-nh}Rb_rLi_lNa_nCs_c(NH_4)_{nh})_2AX_6$, wherein r is in the range of 0-1, wherein l,n,c,nh are each individually preferably in the range of 0-1, preferably 0-0.2, especially 0-0.1, even more especially 0-0.05, and wherein r+l+n+c+nh is in the range of 0-1, especially l+n+c+nh is smaller than 1, especially equal to or smaller than 0.2, preferably in the range of 0-0.2, especially 0-0.1, even more especially 0-0.05. X is preferably fluorine (F).

As indicated above, instead of or in addition to the alkaline cation(s), also one or more alkaline earth cations may be present. Hence, in a specific embodiment, $M'_xM_{2-2x}AX_6$ can also be described as $Mg_{mg}Ca_{ca}Sr_{sr}Ba_{ba}(K_kRb_rLi_lNa_nCs_c(NH_4)_{nh})_2AX_6$, with k, r, l, n, c, nh each individually being in the range of 0-1, wherein mg, ca, sr, ba are each individually in the range of 0-1, and wherein mg+ca+sr+ba+k+r+l+n+c+nh=1. In embodiments, k=1, and the others (mg, ca, sr, ba, r, l, n, c, nh) are zero.

As indicated above, X relates to a monovalent anion, but at least comprises fluorine. Other monovalent anions that may optionally be present may be selected from the group consisting of chlorine (Cl), bromine (Br), and iodine (I). Preferably, at least 80%, even more preferably at least 90%, such as 95% of X consists of fluorine. Hence, in a specific embodiment, $M'_xM_{2-2x}AX_6$ can also be described as $M'_xM_{2-2x}A(F_{1-cl-b-i}Cl_{cl}Br_bI_i)_6$, wherein cl,b,i are each individually preferably in the range of 0-0.2, especially 0-0.1, even more especially 0-0.05, and wherein cl+b+i is smaller than 1, especially equal to or smaller than 0.2, preferably in the range of 0-0.2, especially 0-0.1, even more especially 0-0.05. Especially, X essentially consists of F (fluorine).

Hence, $M'_xM_{2-2x}AX_6$ can also be described as $(K_{1-r-l-n-c-nh}Rb_rLi_lNa_nCs_c(NH_4)_{nh})_2Si_{1-m-l-g-s-zr}Mn_mTi_tGe_gSn_sZr_{zr}(F_{1-cl-b-i}Cl_{cl}Br_bI_i)_6$, with the values for r,l,n,c,nh,m,t,g,s,zr,cl,b,i as indicated above. X is preferably fluorine (F).

Even more especially, $M'_xM_{2-2x}AX_6$ can also be described as $Mg_{mg}Ca_{ca}Sr_{sr}Ba_{ba}(K_kRb_rLi_lNa_nCs_c(NH_4)_{nh})_2Si_{1-m-t-g-s-zr}Mn_mTi_tGe_gSn_sZr_{zr}(F_{1-cl-b-i}Cl_{cl}Br_bI_i)_6$, with k, r, l, n, c, nh each individually being in the range of 0-1, wherein mg, ca, sr, ba are each individually in the range of 0-1, wherein mg+ca+sr+ba+k+r+l+n+c+nh=1, and with the values for m,t,g,s,zr,cl,b,i as indicated above. X is preferably fluorine (F).

In a preferred embodiment, $M'_xM_{2-2x}AX_6$ comprises $K_2SiF_6$ (indicated herein also as KSiF system). As indicated above, in another preferred embodiment, $M'_xM_{2-2x}AX_6$ comprises $KRbSiF_6$ (i.e. r=0.5 and l,n,c,nh,t,g,s,zr,cl,b,i are 0) (herein also indicated as K,Rb system). As indicated above, part of silicon is replaced by manganese (i.e. the formula may also be described as $K_2Si_{1-m}Mn_mF_6$ or $KRbSi_{1-m}Mn_mF_6$, with m as indicated above, or as $KRbSiF_6$:Mn and $K_2SiF_6$:Mn, respectively). As manganese replaces part of a host lattice ion and has a specific function, it is also indicated as "dopant" or "activator". Hence, the hexafluorosilicate is doped or activated with manganese ($Mn^{4+}$).

The luminescent material may also be coated, as also described in WO2013121355A1.

In embodiments, the third luminescent material may comprise $(K,Rb)_2SiF_6:Mn^{4+}$. Alternatively or additionally, in embodiments the third luminescent material may comprise $K_2SiF_6:Mn^{4+}$. Alternatively or additionally, in embodiments the third luminescent material may comprise $K_2TiF_6:Mn^{4+}$. In embodiments, the third luminescent material may comprise $K_2(Si,Ti)F_6:Mn^{4+}$. As can be derived from the above, "Si, Ti" may indicate one or more of Si and Ti.

Such third luminescent material may, upon excitation by the device light, provide third luminescent material light having emission lines (in the red wavelength range) having full width half maxima of at maximum about 20 nm.

Instead of or in addition to the luminescent material of the type $M'_xM_{2-2x}AX_6$ doped with tetravalent manganese, it is also possible to use a quantum structure based luminescent material. Hence, in embodiments the third luminescent material comprises a quantum structure based luminescent material, such as e.g. wherein the third luminescent material comprises quantum dots. Herein, the term "quantum structure based luminescent material" may also be indicated as "quantum structure" or "quantum confinement structure". Examples of quantum structures are also given above: the term "quantum confinement structures" should, in the context of the present application, be understood as e.g. quantum wells, quantum dots, quantum rods, tripods, tetrapods, or nano-wires, etcetera. Quantum structures may also comprise photonic crystals. Quantum structure based luminescent material may comprise e.g. semiconductor materials.

Examples of quantum structure based luminescent material (such as semiconductor nanocrystal (core) shell materials) include, without limitation: red (e.g., (CdSe)ZnS (core) shell), green (e.g., (CdZnSe)CdZnS (core) shell, etc.), and blue (e.g., (CdS)CdZnS (core) shell (see further also above for examples of specific wavelength converter nanoparticles, based on semiconductors). Herein, the terms "semiconductor nanocrystal" and "QD" are used interchangeably. Another term for quantum dots is luminescent nanocrystal. Hence, the above-mentioned outer surface may be the surface of a bare quantum dot (i.e. a QD not comprising a further shell or coating) or may be the surface of a coated quantum dot, such as a core-shell quantum dot (like core-shell or dot-in-rod), i.e. the (outer) surface of the shell. Therefore, in a specific embodiment, the wavelength converter nanoparticles are selected from the group consisting of core-shell nano particles, with the cores and shells comprising one or more of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In general, the cores and shells comprise the same class of material, but essentially consist of different materials, like a ZnS shell surrounding a CdSe core, etc. In an embodiment, the quantum dots comprise core/shell luminescent nanocrystals comprising CdSe/ZnS, InP/ZnS, InP/ZnSe, InP/$ZnSe_{1-x}S_x$, PbSe/PbS, CdSe/CdS, CdTe/CdS or CdTe/ZnS. Further examples of quantum structures are also described above, and may e.g. also include quantum confinement structures such as e.g. quantum wells, quantum dots, quantum rods, tripods, tetrapods, or nano-wires, etcetera.

In specific embodiments, when the third luminescent material comprises a quantum structure based luminescent material, the emission may have a full width half maximum of at maximum about 50 nm, more especially at maximum 40 nm.

Further, it may be desirable to control the melanopic equivalent daylight illuminance of the system light. For instance, it may be possible to control the MEDI (or MDER) while keeping the CCT constant. Hence, dependent upon the situation or application, the MEDI may be chosen higher or lower. For instance, it may also be possible to increase the MEDI and decrease the CCT, when controlling the primary solid state light sources, the secondary solid state light sources, and further light sources, which may emit in the blue-cyan range. Of course, it may also be possible to increase the CCT and also increase MEDI. The blue-cyan wavelength range is the wavelength range of 440-520 nm.

Hence, in embodiments the light generating system may further comprise one or more tertiary solid state light sources configured to generate tertiary light source light having a third dominant wavelength (λ13), in specific embodiments in the wavelength range of 470-520 nm. More especially, the tertiary light source light may have a third dominant wavelength (λ13) selected from the wavelength range of 465-495 nm, preferably 470-500 nm, such as at least about 475 nm, like in embodiments up to about 500 nm, like in specific embodiments selected from the range of 475-495 nm. In other embodiments, the tertiary light source light may have a third dominant wavelength (λ13) selected from the wavelength range of at least 490 nm and/or the tertiary light source light may have a third dominant wavelength (λ13) selected from the wavelength range of at maximum 520.

With such embodiments, the invention may also allow the melanopic equivalent daylight illuminance (MEDI) or melanopic daylight efficacy ratio (MDER) be controlled and/or increased to a relatively high level, beneficial for stimulating circadian rhythm during the day.

Especially, a difference between a peak wavelength of the tertiary light source light and of the primary light may be at least 10 nm, such as at least 15 nm. In specific embodiments, a difference between a peak wavelength of the tertiary light source light and of the primary light may be at least 20 nm.

Especially, the control system may be configured to individually control the one or more primary solid state light sources, the one or more secondary solid state light sources, and the one or more tertiary solid state light sources. In specific embodiments, the control system may be configured to individually control the one or more first pump light sources, the one or more second pump light sources, the one or more secondary solid state light sources, and the one or more tertiary solid state light sources.

Therefore, in embodiments the light generating system may comprise a multi-channel configuration comprising: (i) a first channel comprising the one or more primary solid state light sources (for the primary light for the first luminescent material arrangement), (ii) a second channel comprising the one or more (other) primary solid state light sources (the primary light of for the second luminescent material arrangement), (iii) a third channel comprising the one or more secondary solid state light sources (for the secondary light), and (iv) a fourth channel comprising the one or more tertiary solid state light sources. Yet, in embodiments the light generating system may comprise a multi-channel configuration comprising: (i) a first channel comprising the one or more first pump light sources, (ii) a second channel comprising the one or more second pump light sources, (iii) a third channel comprising the one or more secondary solid state light sources, and (iv) a fourth channel comprising the one or more tertiary solid state light sources.

The light generating system may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting. The light generating system (or luminaire) may be part of or may be applied in e.g. optical communication systems or disinfection systems.

In yet a further aspect, the invention also provides a lamp or a luminaire comprising the light generating system as defined herein. The luminaire may further comprise a housing, optical elements, louvres, etc, etc., The lamp or luminaire may further comprise a housing enclosing the light generating system. The lamp or luminaire may comprise a light window in the housing or a housing opening, through which the system light may escape from the housing. In yet a further aspect, the invention also provides a projection device comprising the light generating system as defined herein. Especially, a projection device or "projector" or "image projector" may be an optical device that projects an image (or moving images) onto a surface, such as e.g. a projection screen. The projection device may include one or more light generating systems such as described herein. Hence, in an aspect the invention also provides a light generating device selected from the group of a lamp, a luminaire, a projector device, a disinfection device, a photochemical reactor, and an optical wireless communication device, comprising the light generating system as defined herein. The light generating device may comprise a housing or a carrier, configured to house or support, one or more elements of the light generating system. For instance, in embodiments the light generating device may comprise a housing or a carrier, configured to house or support one or more of (i) the one or more primary solid state light sources, (ii) the one or more secondary solid state light sources, and (iii) the optional one or more tertiary solid state light sources.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figures 1A, 1B:
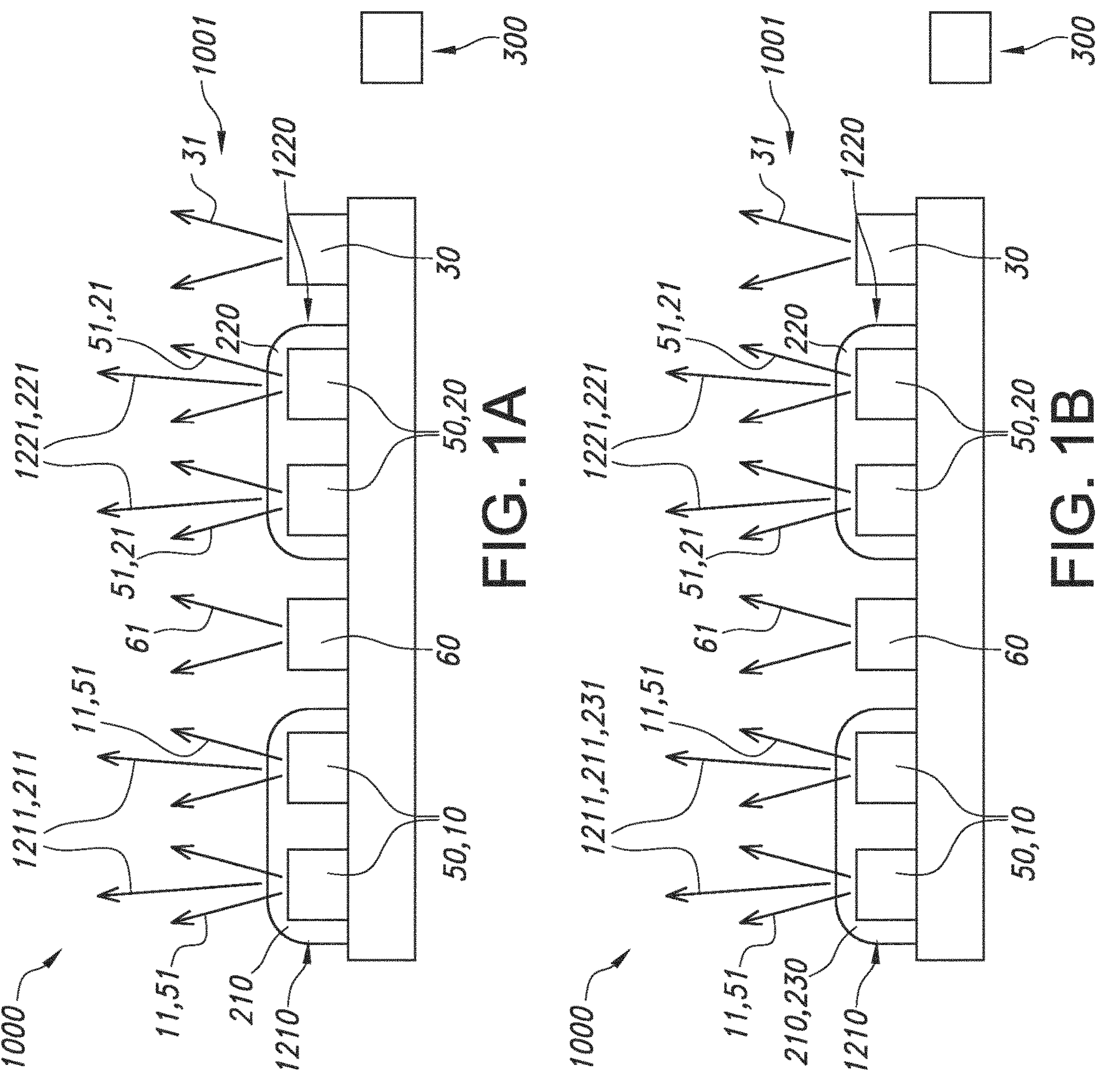
FIG. 1*a*-1*b* schematically depict some embodiments.

FIGS. 1*a*-1*b* schematically depict embodiments of a light generating system 1000 may comprise one or more primary solid state light sources 50, one or more secondary solid state light sources 60, a first luminescent material arrangement 1210, a second luminescent material arrangement 1220, and an optional control system 300.

The one or more primary solid state light sources 50 may be configured to generate primary light 51 having a peak primary wavelength λp1 in the wavelength range of 430-490 nm. Further, the one or more secondary solid state light sources 60 may be configured to generate secondary light 61 having a dominant secondary wavelength λd3 in the wavelength range of 610-630 nm. For the spectral power distributions and the wavelength indications, it is also referred to FIGS. 2*a*-2*d*.

Especially, the first luminescent material arrangement 1210 may be configured in a light receiving relationship with at least one primary solid state light source 50 and may be configured to convert at least part of the primary light 51 of the at least one primary solid state light source 50 into first luminescent material arrangement light 1211. When the at least one primary solid state light source 50 alone irradiates the first luminescent material arrangement 1210 a first spectral power distribution, comprising the primary light 51 (of the at least one primary solid state light source 50) and the first luminescent material arrangement light 1211, may be obtained.

Especially, the second luminescent material arrangement 1220 may be configured in a light receiving relationship with at least one (other) primary solid state light source 50 and may be configured to convert at least part of the primary light 51 into second luminescent material arrangement light 1221. When the at least one (other) primary solid state light source 50 alone irradiates the second luminescent material arrangement 1220 a second spectral power distribution, comprising the primary light 51 (of the at least one primary solid state light source 50) and the second luminescent material arrangement light 1221, may be obtained.

In embodiments, the first spectral power distribution and the second spectral power distribution may have v' values differing at least 0.02. Further, in embodiments the first spectral power distribution may have a first color point outside 10 standard deviation of color matching SDCM from the black body locus, and wherein the second spectral power distribution may have a second color point outside 10 standard deviation of color matching SDCM from the black body locus.

The light generating system 1000 may be configured to generate system light 1001 comprising one or more of the first luminescent material arrangement light 1211, the second luminescent material arrangement light 1221, and the secondary light 61.

The control system 300 may be configured to control the system light 1001, such that: (a) in a first operational mode of the light generating system 1000 first white system light 1001_a_ is provided (see also FIG. 2_a_ left), having a first correlated color temperature CCT1, wherein the first white system light 1001_a_ may comprise a spectral power distribution comprising the primary light 51, the first luminescent material arrangement light 1211, and the secondary light 61; and (b) in a second operational mode of the light generating system 1000 second white system light 1001_b_ is provided (see also FIG. 2_a_ right), having a second correlated color temperature CCT2, wherein the second white system light 1001_b_ may comprise a spectral power distribution comprising the primary light 51, the second luminescent material arrangement light 1221, and the secondary light 61. Further, especially CCT2−CCT1≥500 K.

Referring to FIG. 2_a_, which displays examples, direct red LEDs were combined with off-white (OW) LEDs to generate a color point close to (or slightly below) the BBL (Duv=−0.006-0.000). In case of a CCT tunable system, two different OW channels may be used, at least differing in the amount of conversion at the two different color points. Two examples of (white) spectra are shown in FIG. 2_a_; the off-white spectrum is the dashed line indicated with references 1001_a_ (low CCT, left) and 1001_b_ (high CCT, right). FIG. 2_a_ shows spectra for 2700K (left) and 5000K (right) using direct red LED in combination with OW LEDs, meeting the PIF3 preference requirements. The OW spectrum uses in these examples the same blue pump and green phosphor (different thickness); the same wavelength direct red LED was used at the two CCTs (different contribution).

In embodiments, the first spectral power distribution may have a first color point outside 15 standard deviation of color matching SDCM from the black body locus, especially above the BBL. Further, in embodiments the second spectral power distribution may have a second color point outside 15 standard deviation of color matching SDCM from the black body locus, especially above the BBL.

Especially, the white system light 1001 may have a controllable correlated color temperature over a correlated color temperature range of at least 1000 K, wherein the correlated color temperature range includes the first correlated color temperature CCT1 and the second correlated color temperature CCT2, wherein over the entire correlated color temperature range the system light 1001 may have a duv value, relative to the black body locus, may be selected from the range of 0-0.006.

In (other) specific embodiments, the first correlated color temperature CCT1 may be selected from the range of 1800-4000 K, and the second correlated color temperature CCT2 may be selected from the range of 4000-8000 K. Especially, in embodiments CCT2−CCT1≥1000 K.

Further, in embodiments the peak primary wavelength λp1 may be selected from the wavelength range of 435-460 nm, and the dominant secondary wavelength λd3 may be selected from the wavelength range of 615-625 nm, especially 616-622 nm.

In embodiments, the one or more primary solid state light sources 50 comprise one or more first pump light sources 10 and one or more second pump light sources 20. Especially, the one or more first pump light sources 10 may be configured to generate first pump light 11 having a first pump peak wavelength λp11 in the wavelength range of 430-490 nm and/or the one or more second pump light sources 20 may be configured to generate second pump light 21 having a second pump peak wavelength λp12 in the wavelength range of 430-490 nm.

Especially, the first luminescent material arrangement 1210 may be configured in a light receiving relationship with the one or more first pump light sources 10 and may be configured to convert at least part of the first pump light 11 of the one or more first pump light sources 10 into first luminescent material arrangement light 1211. In embodiments, when the one or more first pump light sources 10 alone irradiate the first luminescent material arrangement 1210 the first spectral power distribution comprising the first pump light 11 (of one or more first pump light sources 10) and the first luminescent material arrangement light 1211, may be obtained.

Alternatively or additionally, especially the second luminescent material arrangement 1220 may be configured in a light receiving relationship with the one or more second pump light sources 20 and may be configured to convert at least part of the second pump light 21 of the one or more second pump light sources 20 into second luminescent material arrangement light 1221. In embodiments, when the one or more second pump light sources 20 alone irradiate the second luminescent material arrangement 1220 the second spectral power distribution comprising the second pump light 21 (of one or more second pump light sources 20) and the second luminescent material arrangement light 1221, may be obtained.

In specific embodiments, the control system 300 may be configured to individually control the one or more first pump light sources 10 and the one or more second pump light sources 20 (and the one or more secondary solid state light sources 60).

Further, especially the first pump peak wavelength λp11 and the second pump peak wavelength λp21 may be the same. Alternatively, however, the first pump peak wavelength λp11 and the second pump peak wavelength λp21 may differ with at least 5 nm.

In embodiments, the first pump peak wavelength λp11 and the second pump peak wavelength λp12 may be selected from the wavelength range of 435-460 nm and/or the dominant secondary wavelength λd3 may be selected from the wavelength range of 615-625 nm.

Especially, the first spectral power distribution may have a first color point with $0.333 \le x \le 0.387$ and $0.437 \le y \le 0.473$, and/or the second spectral power distribution has the second color point as defined in claim 2 with $0.258 \le x \le 0.302$ and $0.331 \le y \le 0.358$.

In embodiments, the first luminescent material arrangement 1210 may comprise a first luminescent material 210, wherein the second luminescent material arrangement 1220 may comprise a second luminescent material 220, wherein both the first luminescent material 210 and the second luminescent material 220 comprise a luminescent material of the type $A_3B_5O_{12}$:Ce, wherein A may comprise one or more of Y, La, Gd, Tb and Lu, and wherein B may comprise one or more of Al, Ga, In and Sc.

Especially, the first luminescent material 210 may be configured to convert at least part of the primary light 51 of the at least one primary solid state light source 50 into first luminescent material light 211, wherein the first luminescent material arrangement light 1211 may comprise the first luminescent material light 211, wherein the first luminescent material light 211 may have a first centroid wavelength selected from the wavelength range of 520-570 nm.

Alternatively or additionally, the second luminescent material 220 may be configured to convert at least part of the primary light 51 of the at least one (other) primary solid state light source 50 into second luminescent material light 221, wherein the second luminescent material arrangement light 1221 may comprise the second luminescent material light 221, wherein the second luminescent material light 221 may have a second centroid wavelength selected from the wavelength range of 520-570 nm.

The first luminescent material 210 and the second luminescent material 220 may be different luminescent materials. In specific embodiments, the first luminescent material light 211 may be red-shifted relative to the second luminescent material light 221. Hence, the second luminescent material light 221 may be blue-shifted relative to the first luminescent material light 211. The centroid wavelengths may essentially be the same, or may differ. In the latter embodiments, the first centroid wavelength and the second centroid wavelength may e.g. differ with at least 5 nm and at maximum 70 nm.

Figure 2A:
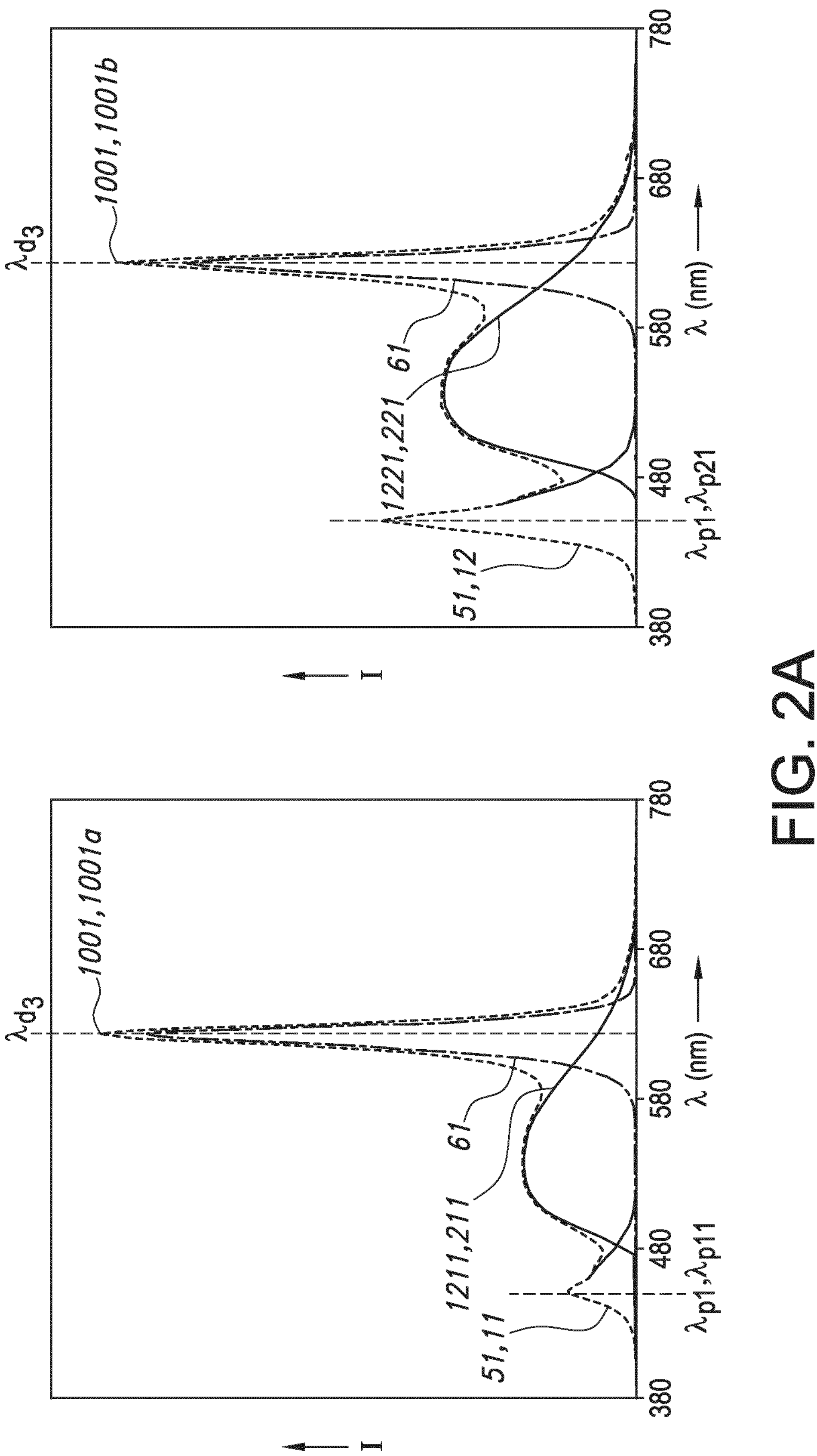
FIGS. 2*a*-2*c* show some spectral power distributions and FIG. 2*d* shows the CIE color diagram.
Figure 2C:
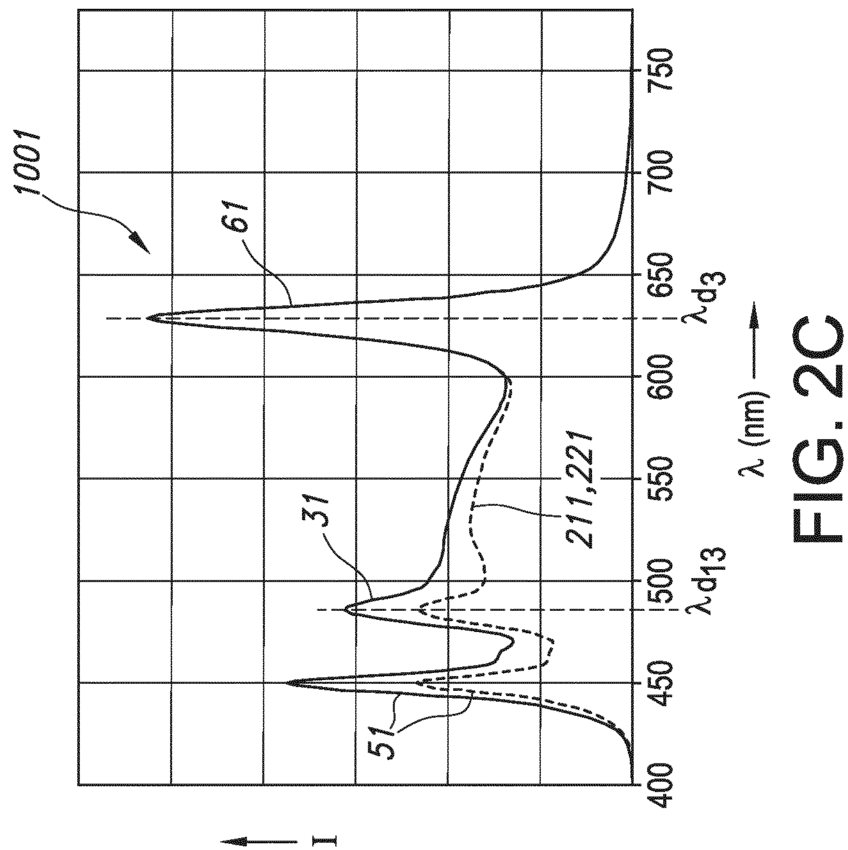
Figure 2B:
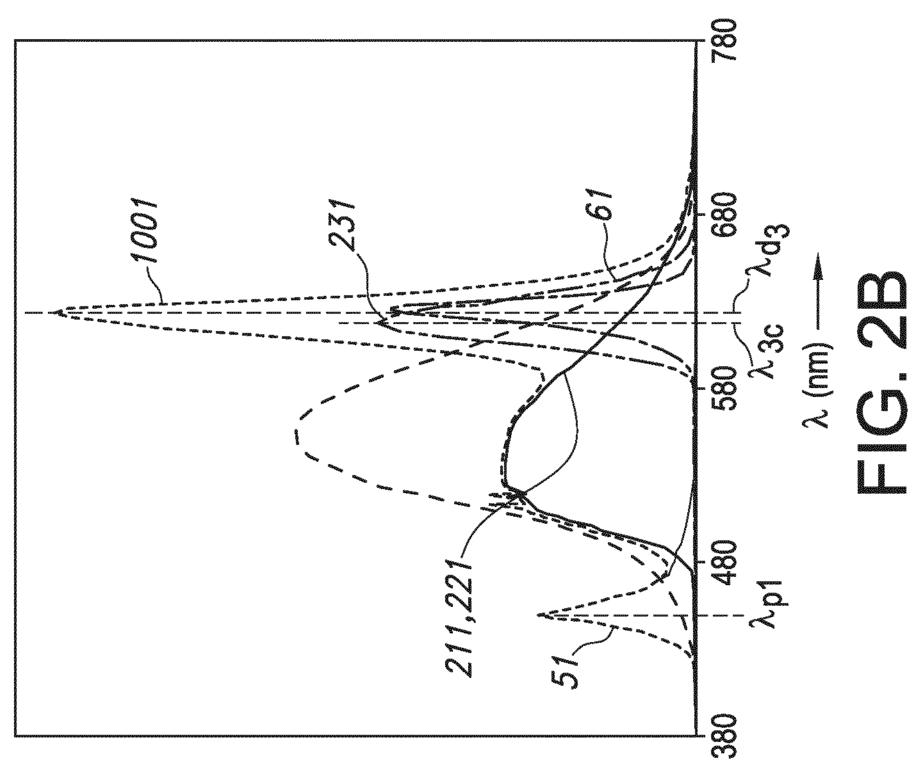

Referring to FIG. 1*b*, yet further, the first luminescent material arrangement 1210 may comprise a third luminescent material 230, wherein the third luminescent material may be configured to convert at least part of the primary light 51 of the at least one primary solid state light source 50 into third luminescent material light 231, see also FIG. 2*b*. In yet further specific embodiments, the third luminescent material light 231 may have a centroid wavelength \3*c* selected from the range of 610-650 nm and a full width half maximum of 60 nm or smaller. Suitable luminescent materials may quantum structure based materials like quantum dots, quantum rods, etc. Other suitable materials may be $K_2SiF_6$ type of materials, doped with tetravalent manganese.

Referring to e.g. FIG. 1*a*-1*b*, embodiments may also be possible wherein part of the primary light bypasses first luminescent material arrangement and the second luminescent material arrangement. This may be the case when e.g. one or more further primary solid state light sources 50 are configured in such a way, that the primary light thereof does not essentially irradiate the first luminescent material arrangement and the second luminescent material arrangement and can thus not be absorbed at all by the first luminescent material arrangement and/or the second luminescent material arrangement. For instance, downstream of those one or more further primary solid state light sources 50 there is no luminescent material, allowing the primary light of such one or more further primary solid state light sources bypassing the first luminescent material arrangement and the second luminescent material arrangement.

Referring to FIG. 2*b*, the amount of red light needed to generate 2700 K may be about 2.5 times higher than needed to generate 5000 K (due to the bigger distance between the OW color point and the BBL at 2700 K and 5000 K). For a tunable light generating device that may be less desirable as this may e.g. imply one may need to over-install the number of red LEDs (or drive them much harder in the warm white region), resulting in lower efficiency. This may be improved by shifting the OW color point by adding some red emitting phosphor. Red shifting by using a normal (~80-100 nm broad) (nitride) phosphor may be less desirable in view of efficiency. Hence, the use of narrow red emitters may be preferred. A straightforward option would be to replace part of the direct LED light with quantum dots (or another narrow-band emitter) emitting light of the same wavelength (and comparable emission width) as the red LED. Surprisingly, it appears that it is possible to also shift the emission of the narrow-band emitter, such as quantum dots, towards shorter wavelength. This seems beneficial for the efficiency (just enough saturation for red, in combination with reduced stokes loss). This can be seen in FIG. 2*b*, which shows OW LED with quantum dot contribution (reference 231) combined with direct red LED. The amount of direct red LED light is equal to that in the 5000 K spectrum in FIG. 2*a* right, and still the P1F3 color quality requirements are fulfilled.

Referring to FIGS. 1*a*-1*b*, the invention can be realized by using various types of LED packages. The highest efficiency can be achieved by using flip-chip MP architecture for OW in combination with HP architecture for red. Useful for a high WPE of the red LED is the large chip and the dome for outcoupling; this could in principle also be incorporated in a MP package. Also other packages can be used, e.g. MP with lateral chip for OW. Alternatively, the invention can e.g. be realized by combining the OW and red primaries in one package with min 4 leads to enable individual driving. The blue chip for the OW channel and the red chip for the red channel can be covered by the same phosphor needed for the OW channel, as it will only be excited by the blue light and not by the red light. The phosphor will act as a scatterer and hence outcoupling agent for the red light. The benefit over individual OW and red LEDs is the better/easier color mixing. Another embodiment is a 3-channel COB with either different phosphors for the 2 OW channels, or a single phosphor layer over all the chips at the expense of some efficiency.

It appeared not obvious to meet the PIF3 requirements, especially in the warm white region. Simulations with different OW spectra were performed, using different blue pump wavelengths and a set of green/yellow phosphors. Amongst others, the efficiency as a function of CCT for P1F3 was evaluated. Different panels were used: different green/yellow phosphor used for the OW LED; different red LED wavelengths were used. With PWL (peak wavelength) (blue) of 440 nm, a DWL between 614-622.4 nm appears to give good results. With PWL (blue) of 445 nm, a DWL between 614-622.4 nm appears to give good results. Likewise this applies for a PWL (blue) of 450 nm and 455 nm.

The tunable system will consist of two different off-white channels with different color points. It appears, however, less desirable that both channels use the same blue pump wavelength and/or phosphor, but it appears more desirable to use two optimal off-white LEDs for corner CCT targets (e.g. 2700 K and 5000 K), where each will satisfy color quality requirements with optimized efficiency. Mixing of these two off-white LEDs for reaching intermediate CCT will also satisfy color quality limits in an efficient way. It is, however, desired that the same red LED is used across the CCTs range (otherwise 4 independent channels would be required).

To achieve the highest efficiency at 2700 K, especially a 455 nm blue LED in combination with a yellow phosphor (u'=0.191) in combination with a red LED with a dominant wavelength of 616-619 nm can be used. Using a 450 nm blue pump may result in a lower efficiency, whereas it becomes challenging to reach PIF3 requirements at low CCTs for even shorter blue pump wavelengths.

Hence, as can be derived from the above, direct red LEDs in combination with two off-white phosphor-converted LEDs appear to be the most efficient way to produce white light with high user preferences (e.g. P1F3). However, such combination of these LEDs may have some limitations in producing MDER-enhanced white light (Melanopic daylight equivalent ratio).

Using an additional separately addressable channel with direct cyan LED allows to efficiently improve the MDER for above systems with minimal impact on white light efficacy, at the end it will result in most efficient way to generate MDER enhanced white light of high user preference ranks (e.g. P1F3). The table below shows few examples of performance values for white tunable systems with direct red LED, direct cyan (where used) and two off-white phosphor converted LEDs (PC-LEDs), one optimized for warm color point (e.g. "2700K" target) another for cold color point (e.g. "5000K" target). Two examples of (white) spectra with optimized MDER are shown in FIG. 2*c*.

The below table provides scenarios and performance values (MDER, luminous efficacy and differences) for combined white light source@ 4000K on BBL: Direct red+2× OW and Direct Red, Direct Cyan+2× OW:

| Scenario 4000K | $\lambda_{peak}$ Blue (nm) | $\lambda_{dom}$ Cyan (nm) | Cyan/Red power ratio | MDER | Lm/W | Lm/ W*MDER | Gain vs. ref |
|---|---|---|---|---|---|---|---|
| Ref. DR + 2OW | 453 | NA | 0 | 0.68 | 243.5 | 166 | |
| Opt. MDER Cyan | 450 | 488 | 0.52 | 0.8 (+18%) | 230 | 184 | +11% |
| Mod. MDER Cyan | 453 | 488 | 0.35 | 0.78 (+14%) | 232 | 181 | +9% |

The below table provides scenarios and performance values (MDER, luminous efficacy and differences) for combined white light source@ 5000K on BBL: Direct red+2× OW and Direct Red, Direct Cyan+2× OW:

| Scenario 5000K | $\lambda_{peak}$ Blue (nm) | $\lambda_{dom}$ Cyan (nm) | Cyan/Red power ratio | MDER | Lm/W | Lm/ W*MDER | Gain vs. ref |
|---|---|---|---|---|---|---|---|
| Ref. DR + x2OW | 453 | NA | 0 | 0.85 | 236.5 | 201 | |
| Opt. MDER Cyan | 450 | 488 | 0.66 | 0.964 (+13%) | 222 | 214 | +7% |
| Mod. MDER Cyan | 453 | 488 | 0.4 | 0.932 (+10%) | 226 | 210 | +5% |

Hence, referring to FIGS. 1*a*-1*b*, in specific embodiments, the light generating system 1000 may further comprise one or more tertiary solid state light sources 30 configured to generate tertiary light source light 31 having a third dominant wavelength λ13 in the wavelength range of 470-520 nm such as at least about 475 nm, like in embodiments selected from the range of 465-495 nm, more preferably in the range of 475-495 nm, see also FIG. 2*c*.

Using of additional cyan channel allows also to realize dynamic variation of MDER values for proposed configuration by changing ratio of cyan chip emission in the spectrum between maximum value and zero (no additional cyan emission and as a result lower MDER values). FIG. 2*c* shows to spectral power distribution for 4000 K (dashed) and 5000K (solid) using direct red and cyan LEDs in combination with OW LEDs, optimized for maximal MDER while meeting the P1F3 preference requirements. The OW spectrum uses in this case the same blue pump (453 nm dominant) and green phosphor (different thickness) as used in the examples of FIGS. 2*a*-2*b*.

It appears not obvious to meet the PIF3 requirements, especially by maximizing MDER values in spectra by using Cyan LEDs. Simulations of a white tunable system using a few different Cyan LED (different DWL) were performed, using also two cases of different blue pump wavelength and pre-selected types of phosphors for off-white LEDs. In the simulations, cyan LEDs with dominant wavelengths: 478 nm, 488 nm and 495 nm were used, as well as a direct Red, and two off-white LEDs with "5000 K" and "2700 K" "CCTs".

It appeared that maximal MDER could be obtained for cyan LEDs with dominant wavelength around 488 nm, which can be considered as optimal wavelength position for cyan LED. It also can be seen, that off-white LED "5000K" with a bit shorter pump wavelength of ~450 nm may give higher MDER values than off-white LED "5000K" with a pump wavelength of ~453 nm (which is a desirable pump wavelength to meet PIF3 requirements on BBL if cyan LED emission is not present in the spectrum, i.e. only direct red 2× OW LEDs are used (see also above). A reason of using less optimal (for highest MDER) peak wavelength for pump blue chip of ~453 nm in "5000K" Off-white LED might rise from need to vary MDER values independently from CCT of white light ("dynamic MDER") by changing intensity of cyan LED chip between maximum level and zero, while meeting PIF3 color quality requirements in all cases.

Figure 2D:
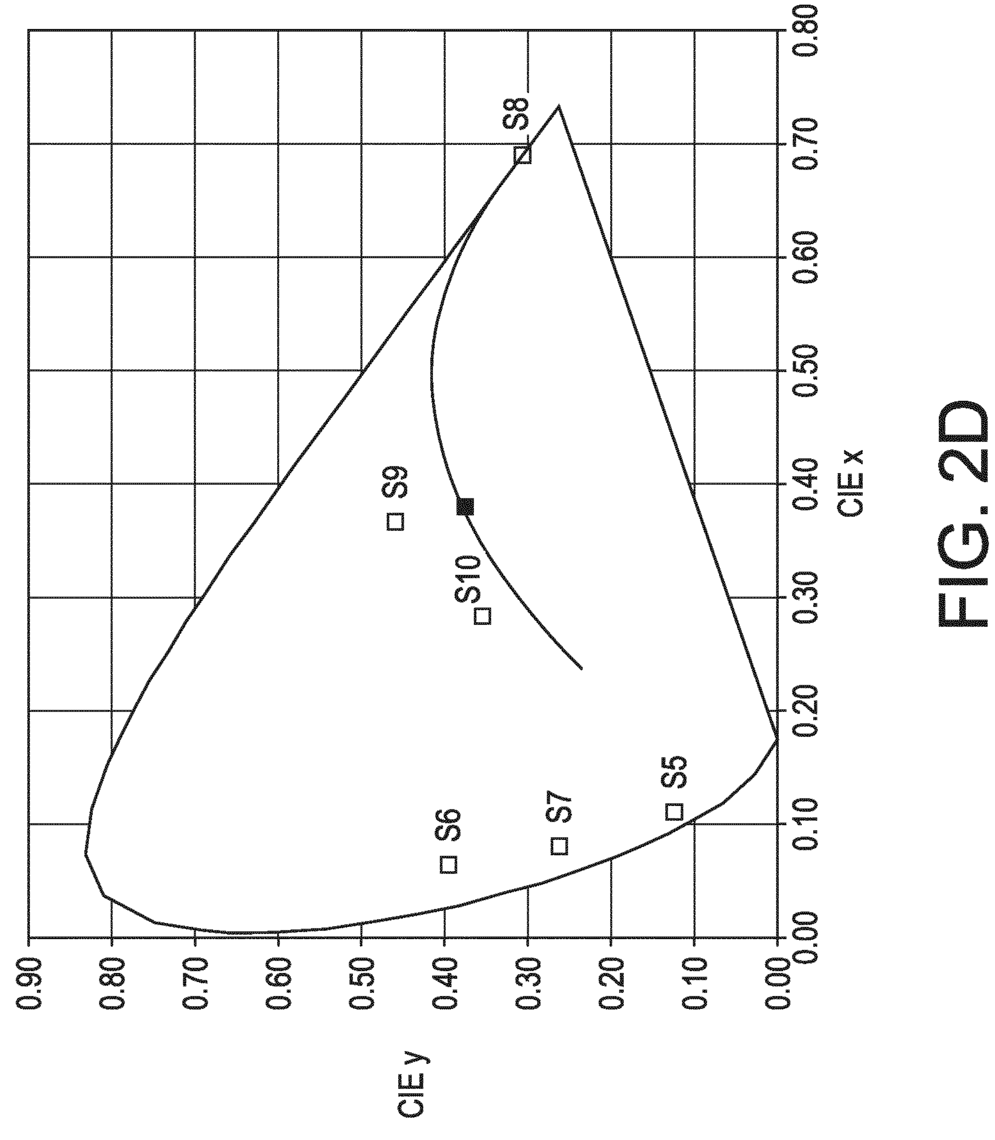

FIG. 2*d* shows examples of primary color points for Off-White LEDs (S10: "5000 K", S9: "2700K"), direct red LED (S8: 619 nm dominant wavelength), and a range of cyan LEDs (min S5: 478 nm, median S7: 488 nm and max S6: 495 nm). The color points S9 and S10 may especially be outside 10 SDCM above the black body locus.

In general, the higher relative contribution of cyan LED in total spectrum, the higher MDER values can be reached, but too high cyan intensity may reduce color quality parameters of white spectra. So, cyan intensity should not exceed certain levels in order to comply with PIF3 color quality requirements. There appears to be a trade-off between maximizing MDER and meeting high color preference requirements. Choice of dominant wavelength for the cyan LED will determine what maximal relative optical power from cyan LED can be present in total spectrum (e.g. as ratio to red LED optical power), when color quality will be meeting PIF3 requirements.

Figure 3:
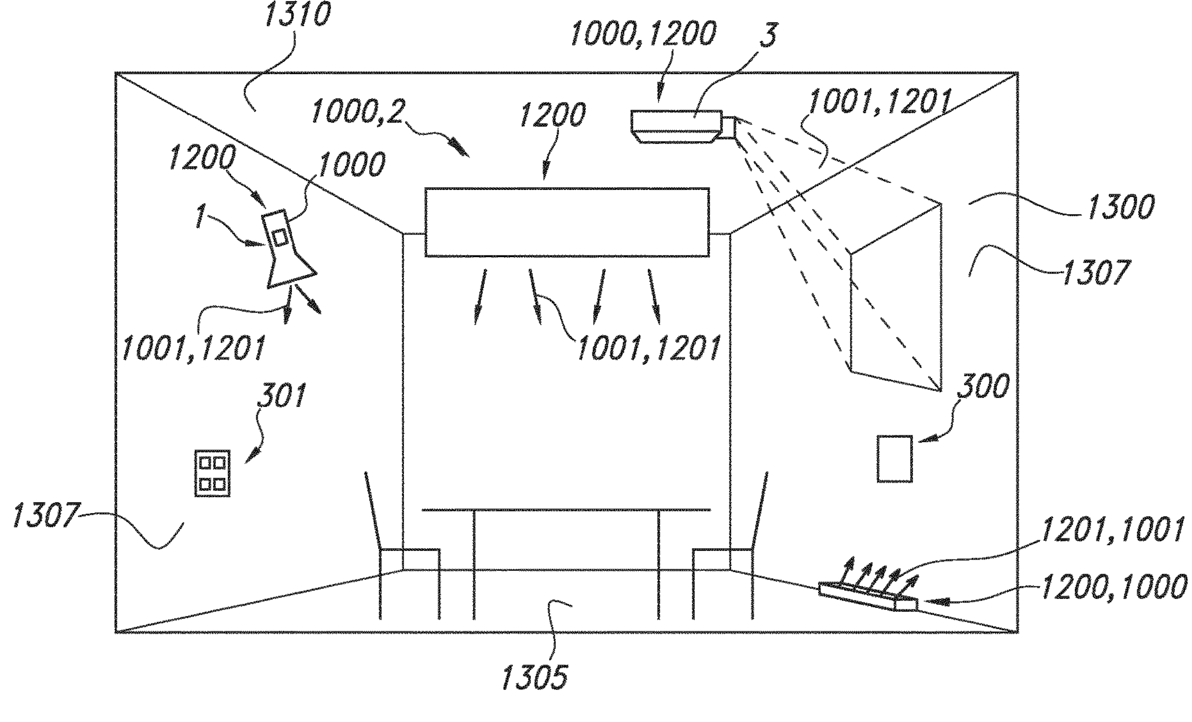
FIG. 3 schematically depict some applications.

FIG. 3 schematically depicts an embodiment of a luminaire 2 comprising the light generating system 1000 as described above. Reference 301 indicates a user interface which may be functionally coupled with the control system 300 comprised by or functionally coupled to the light generating system 1000. FIG. 3 also schematically depicts an embodiment of lamp 1 comprising the light generating system 1000. Reference 3 indicates a projector device or projector system, which may be used to project images, such as at a wall, which may also comprise the light generating system 1000. Hence, FIG. 3 schematically depicts embodiments of a lighting device 1200 selected from the group of a lamp 1, a luminaire 2, a projector device 3, a disinfection device, a photochemical reactor, and an optical wireless communication device, comprising the light generating system 1000 as described herein. In embodiments, such lighting device may be a lamp 1, a luminaire 2, a projector device 3, a disinfection device, or an optical wireless communication device. Lighting device light escaping from the lighting device 1200 is indicated with reference 1201. Lighting device light 1201 may essentially consist of system light 1001, and may in specific embodiments thus be system light 1001. Reference 1300 refers to a space, such as a room. Reference 1305 refers to a floor and reference 1310 to a ceiling; reference 1307 refers to a wall.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage. In yet a further aspect, the invention (thus) provides a software product, which, when running on a computer is capable of bringing about (one or more embodiments of) the method as described herein.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating system comprising one or more primary solid state light sources, one or more secondary solid state light sources, a first luminescent material arrangement, a second luminescent material arrangement, and a control system, wherein:

- the one or more primary solid state light sources are configured to generate primary light having a peak primary wavelength (λp1) in the wavelength range of 430-490 nm;
- the one or more secondary solid state light sources are configured to generate secondary light having a dominant secondary wavelength (λd3) in the wavelength range of 610-630 nm;
- the first luminescent material arrangement is configured in a light receiving relationship with at least one primary solid state light source and is configured to convert at least part of the primary light of the at least one primary solid state light source into first luminescent material arrangement light; wherein when the at least one primary solid state light source alone irradiates the first luminescent material arrangement a first spectral power distribution, comprising the primary light and the first luminescent material arrangement light, is obtained;
- the second luminescent material arrangement is configured in a light receiving relationship with at least one primary solid state light source and is configured to convert at least part of the primary light into second luminescent material arrangement light; wherein when the at least one primary solid state light source alone irradiates the second luminescent material arrangement a second spectral power distribution, comprising the primary light and the second luminescent material arrangement light, is obtained;
- the first spectral power distribution and the second spectral power distribution have v' values differing at least 0.02; wherein the first spectral power distribution has a first color point outside 10 standard deviation of color matching (SDCM) from the black body locus, and wherein the second spectral power distribution has a second color point outside 10 standard deviation of color matching (SDCM) from the black body locus;
- the light generating system is configured to generate system light; and
- the control system is configured to control the system light, such that:
  - in a first operational mode of the light generating system first white system light is provided, having a first correlated color temperature CCT1, wherein the first white system light comprises a spectral power distribution comprising the primary light, the first luminescent material arrangement light, and the secondary light;
  - in a second operational mode of the light generating system second white system light is provided, having a second correlated color temperature CCT2, wherein the second white system light comprises a spectral power distribution comprising the primary light, the second luminescent material arrangement light, and the secondary light; and $$CCT2 - CCT1 \geq 500 \text{ K}.$$

2. The light generating system according to claim 1, wherein the first spectral power distribution has a first color point outside 15 standard deviation of color matching (SDCM) from the black body locus, and wherein the second spectral power distribution has a second color point outside 15 standard deviation of color matching (SDCM) from the black body locus.

3. The light generating system according to claim 1, wherein the white system light has a controllable correlated color temperature over a correlated color temperature range of at least 1000 K, wherein the correlated color temperature range includes the first correlated color temperature CCT1 and the second correlated color temperature CCT2, wherein over the entire correlated color temperature range the system light has a duv value of +/−0.01 relative to the black body locus.

4. The light generating system according to claim 3, wherein the first correlated color temperature CCT1 is selected from the range of 1800-4000 K, and wherein the second correlated color temperature CCT2 is selected from the range of 4000-8000 K; wherein CCT2–CCT1≥1000 K; wherein the peak primary wavelength (λp1) is selected from the wavelength range of 435-460 nm, and wherein the dominant secondary wavelength (λd3) is selected from the wavelength range of 615-625 nm.

5. The light generating system according to claim 1, wherein the one or more primary solid state light sources comprise one or more first pump light sources and one or more second pump light sources; wherein:

the one or more first pump light sources are configured to generate first pump light having a first pump peak wavelength (λp11) in the wavelength range of 430-490 nm;

the one or more second pump light sources are configured to generate second pump light having a second pump peak wavelength (λp11) in the wavelength range of 430-490 nm;

the first luminescent material arrangement is configured in a light receiving relationship with the one or more first pump light sources and is configured to convert at least part of the first pump light of the one or more first pump light sources into first luminescent material arrangement light; wherein when the one or more first pump light sources alone irradiate the first luminescent material arrangement the first spectral power distribution comprising the first pump light and the first luminescent material arrangement light, is obtained; and the second luminescent material arrangement is configured in a light receiving relationship with the one or more second pump light sources and is configured to convert at least part of the second pump light of the one or more second pump light sources into second luminescent material arrangement light; wherein when the one or more second pump light sources alone irradiate the second luminescent material arrangement the second spectral power distribution comprising the second pump light and the second luminescent material arrangement light, is obtained.

6. The light generating system according to claim 5, wherein the control system is configured to individually control the one or more first pump light sources and the one or more second pump light sources.

7. The light generating system according to claim 5, wherein the first pump peak wavelength (λp11) and the second pump peak wavelength (λp21) are the same.

8. The light generating system according to claim 5, wherein the first pump peak wavelength (λp11) and the second pump peak wavelength (λp21) differ with at least 5 nm.

9. The light generating system according to claim 5, wherein the first pump peak wavelength (λp11) and the second pump peak wavelength (λ12) are selected from the wavelength range of 435-460 nm, and wherein the dominant secondary wavelength (λd3) is selected from the wavelength range of 615-625 nm.

10. The light generating system according to claim 1, wherein the first spectral power distribution has a first color point with $0.333 \leq x \leq 0.387$ and $0.437 \leq y \leq 0.473$, and wherein the second spectral power distribution has the second color point as defined in claim 2 with $0.258 \leq x \leq 0.302$ and $0.331 \leq y \leq 0.358$.

11. The light generating system according to claim 1, wherein:

the first luminescent material arrangement comprises a first luminescent material, wherein the second luminescent material arrangement comprises a second luminescent material, wherein both the first luminescent material and the second luminescent material comprise a luminescent material of the type $A_3B_5O_{12}$:Ce, wherein A comprises one or more of Y, La, Gd, Tb and Lu, and wherein B comprises one or more of Al, Ga, In and Sc;

the first luminescent material is configured to convert at least part of the primary light of the at least one primary solid state light source into first luminescent material light, wherein the first luminescent material arrangement light comprises the first luminescent material light, wherein the first luminescent material light has a first centroid wavelength selected from the wavelength range of 520-570 nm;

the second luminescent material is configured to convert at least part of the primary light of the at least one primary solid state light source into second luminescent material light, wherein the second luminescent material arrangement light comprises the second luminescent material light, wherein the second luminescent material light has a second centroid wavelength selected from the wavelength range of 520-570 nm.

12. The light generating system according to claim 11, wherein the first luminescent material and the second luminescent material are different luminescent materials, wherein the first luminescent material light is red-shifted relative to the second luminescent material light.

13. The light generating system according to claim 1, wherein the first luminescent material arrangement comprises a third luminescent material, wherein the third luminescent material is configured to convert at least part of the primary light of the at least one primary solid state light source into third luminescent material light; wherein the third luminescent material light has a centroid wavelength (λ3c) selected from the range of 610-650 nm and a full width half maximum of 60 nm or smaller.

14. The light generating system according to claim 1, further comprising one or more tertiary solid state light sources configured to generate tertiary light source light having a third dominant wavelength (λ13) in the wavelength range of 465-495 nm.

15. A lighting device selected from the group of a lamp, a luminaire, a projector device, a disinfection device, a photochemical reactor, and an optical wireless communication device, comprising the light generating system according to claim 1.

* * * * *